US012796133B2

(12) United States Patent
Lee et al.

(10) Patent No.: US 12,796,133 B2
(45) Date of Patent: Nov. 10, 2026

(54) IMAGE SENSOR INCLUDING SUBSTRATE WITH ISOLATION STRUCTURE DIVIDING ANALOG AND DIGITAL BLOCKS

(71) Applicant: SAMSUNG ELECTRONICS CO., LTD., Suwon-si (KR)

(72) Inventors: Jaekyu Lee, Suwon-si (KR); Jeongjin Lee, Suwon-si (KR); Dongseok Cho, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 663 days.

(21) Appl. No.: 18/216,211

(22) Filed: Jun. 29, 2023

(65) Prior Publication Data

US 2024/0047493 A1 Feb. 8, 2024

(30) Foreign Application Priority Data

Aug. 2, 2022 (KR) ........................ 10-2022-0095895

(51) Int. Cl.
*H10F 39/00* (2025.01)

(52) U.S. Cl.
CPC ....... *H10F 39/8053* (2025.01); *H10F 39/024* (2025.01); *H10F 39/8037* (2025.01); *H10F 39/8063* (2025.01); *H10F 39/807* (2025.01); *H10F 39/811* (2025.01)

(58) Field of Classification Search
CPC ............... H10F 39/8053; H10F 39/024; H10F 39/8037; H10F 39/8063; H10F 39/807; H10F 39/811; H10F 39/018; H10F 39/12; H10F 39/199; H10F 39/809; H10F 39/813; H10F 39/014

See application file for complete search history.

(56) References Cited

U.S. PATENT DOCUMENTS

| | | | | |
|---|---|---|---|---|
| 7,462,520 | B2 | 12/2008 | Park et al. | |
| 8,410,961 | B2 | 4/2013 | Iwabuchi | |
| 8,450,836 | B2 | 5/2013 | Uemura et al. | |
| 10,192,919 | B2 * | 1/2019 | Barr | H10F 39/811 |
| 10,438,951 | B2 | 10/2019 | Fujii et al. | |

(Continued)

FOREIGN PATENT DOCUMENTS

| | | | |
|---|---|---|---|
| JP | 2017-147465 | A | 8/2017 |
| JP | 6557134 | B2 | 8/2019 |

(Continued)

*Primary Examiner* — William B Partridge
*Assistant Examiner* — John Patrick Cornely
(74) *Attorney, Agent, or Firm* — Sughrue Mion, PLLC

(57) ABSTRACT

An image sensor includes a first substrate including an analog block and a digital block, an isolation structure extending through the first substrate and dividing the analog block from the digital block, a first transistor on the digital block, a second transistor on the analog block, a wiring on and electrically connected to the second transistor, a second substrate on the wiring, a color filter array layer on the second substrate and including color filters, a microlens on the color filter array layer, a light sensing element in the second substrate, a transfer gate (TG) extending through a lower portion of the second substrate adjacent to the light sensing element, and a floating diffusion (FD) region at a lower portion of the second substrate adjacent to the TG and electrically connected to the wiring.

18 Claims, 24 Drawing Sheets

(56) References Cited

U.S. PATENT DOCUMENTS

| | | | | |
|---|---|---|---|---|
| 2002/0102814 | A1* | 8/2002 | Olsen | H10D 64/01342<br>257/E21.549 |
| 2007/0020796 | A1 | 1/2007 | Park | |
| 2009/0096050 | A1* | 4/2009 | Park | H10F 39/8063<br>257/E31.127 |
| 2016/0358967 | A1* | 12/2016 | Madurawe | H10F 39/199 |
| 2018/0308881 | A1* | 10/2018 | Hynecek | G01S 17/10 |
| 2020/0092506 | A1* | 3/2020 | Park | H04N 25/79 |
| 2021/0118933 | A1 | 4/2021 | Sze et al. | |
| 2021/0408090 | A1 | 12/2021 | Kohyama | |

FOREIGN PATENT DOCUMENTS

| | | | |
|---|---|---|---|
| KR | 10-0697290 | B1 | 3/2007 |
| KR | 10-2014-0020708 | A | 2/2014 |
| KR | 10-2019-0142549 | A | 12/2019 |
| WO | 2021/171795 | A1 | 9/2021 |

* cited by examiner

IMAGE SENSOR INCLUDING SUBSTRATE WITH ISOLATION STRUCTURE DIVIDING ANALOG AND DIGITAL BLOCKS

CROSS-REFERENCE TO RELATED APPLICATION

This application claims priority to Korean Patent Application No. 10-2022-0095895, filed on Aug. 2, 2022 in the Korean Intellectual Property Office (KIPO), the contents of which is incorporated by reference herein in its entirety.

BACKGROUND

1. Field

Example embodiments relate to an image sensor and a method of manufacturing the same.

2. Description of the Related Art

As the electronic industry develops, the size of the image sensor has decreased, and thus various studies have been performed in order to satisfy the need for the high integration degree of the image sensor.

The high integration degree of the image sensor may increase the electric interference between circuit patterns, and thus a solution for decreasing the electric interference is needed.

SUMMARY

One or more example embodiments provide an image sensor having improved characteristics and a method of manufacturing an image sensor having improved characteristics.

According to an aspect of an example embodiment, an image sensor includes: a first substrate comprising an analog block and a digital block; an isolation structure extending through the first substrate and dividing the analog block from the digital block; a first transistor on the digital block; a second transistor on the analog block; a wiring on and electrically connected to the second transistor; a second substrate on the wiring; a color filter array layer on the second substrate, the color filter array layer comprising color filters; a microlens on the color filter array layer; a light sensing element in the second substrate; a transfer gate extending through a lower portion of the second substrate, the transfer gate being adjacent to the light sensing element; and a floating diffusion region at a lower portion of the second substrate adjacent to the transfer gate, the floating diffusion region being electrically connected to the wiring.

According to an aspect of an example embodiment, an image sensor includes: a first substrate; an isolation structure comprising: a first isolation pattern extending through an upper portion of the first substrate; and a second isolation pattern structure extending through a lower portion of the first substrate and contacting the first isolation pattern, the second isolation pattern structure comprising a material different from a material of the first isolation pattern; a first transistor on the first substrate; a wiring on and electrically connected to the first transistor; a second substrate on the wiring; a color filter array layer on the second substrate, the color filter array layer comprising color filters; a microlens on the color filter array layer; a light sensing element in the second substrate; a transfer gate extending through a lower portion of the second substrate, the transfer gate being adjacent to the light sensing element; and a floating diffusion region at a lower portion of the second substrate adjacent to the transfer gate, the floating diffusion region being electrically connected to the wiring.

According to an aspect of an example embodiment, a method of manufacturing an image sensor includes: forming a first isolation pattern at least partially through a first substrate comprising first and second surfaces opposite to each other, the first isolation pattern extending through a portion of the first substrate adjacent to the second surface of the first substrate; forming circuit patterns on the second surface of the first substrate; forming a first insulating interlayer on the second surface of the first substrate on the circuit patterns; forming a light sensing element in a second substrate comprising first and second surfaces opposite to each other; forming a transfer gate through a portion of the second substrate adjacent to the second surface of the second substrate; forming a floating diffusion region at a portion of the second substrate adjacent to the transfer gate; forming a second insulating interlayer on the second surface of the second substrate, the transfer gate and the floating diffusion region; bonding the first substrate and the second substrate so that the second insulating interlayer on the second substrate and the first insulating interlayer on the first substrate face each other; and forming a second isolation pattern structure through a portion of the first substrate adjacent to the first surface of the first substrate to contact the first isolation pattern.

According to an aspect of an example embodiment, a method of manufacturing an image sensor includes: forming a first isolation pattern partially through a first substrate to divide the first substrate into an analog block and a digital block, the first substrate comprising first and second surfaces opposite to each other, and the first isolation pattern extending through a portion of the first substrate adjacent to the second surface of the first substrate; forming an analog circuit pattern in the analog block and a digital circuit pattern in the digital block; forming a first insulating interlayer on the second surface of the first substrate, the analog circuit pattern and the digital circuit pattern; forming a light sensing element in a second substrate comprising first and second surfaces opposite to each other; forming a transfer gate through a portion of the second substrate adjacent to the second surface of the second substrate; forming a floating diffusion region at a portion of the second substrate adjacent to the transfer gate; forming a second insulating interlayer on the second surface of the second substrate, the transfer gate and the floating diffusion region; bonding the first substrate and the second substrate so that the second insulating interlayer on the second substrate and the first insulating interlayer on the first substrate face each other; and forming a second isolation pattern structure through a portion of the first substrate adjacent to the first surface of the first substrate to contact the first isolation pattern, wherein the first isolation pattern and the second isolation pattern structure form an isolation structure extending through the first substrate and dividing the analog block from the digital block.

According to an aspect of an example embodiment, a method of manufacturing an image sensor includes: forming a logic circuit pattern on a first substrate; forming a first insulating interlayer on the first substrate and the logic circuit pattern; forming a first isolation pattern at least partially through a second substrate comprising first and second surfaces to divide the second substrate into an analog block and a digital block, the first isolation pattern extending through a portion of the second substrate adjacent to the second surface of the second substrate; forming an analog circuit pattern in the analog block and a digital circuit pattern in the digital block; forming a second insulating interlayer on the second surface of the second substrate, the analog circuit pattern and the digital circuit pattern; forming a light sensing element in a third substrate comprising first and second surfaces opposite to each other; forming a transfer gate through a portion of the third substrate adjacent to the second surface of the third substrate; forming a floating diffusion region at a portion of the third substrate adjacent to the transfer gate; forming a third insulating interlayer on the second surface of the third substrate, the transfer gate and the floating diffusion region; bonding the second and third substrates so that the third insulating interlayer on the third substrate and the second insulating interlayer on the second substrate face each other; forming a second isolation pattern structure through a portion of the second substrate adjacent to the first surface of the second substrate to contact the first isolation pattern; forming a fourth insulating interlayer on the first surface of the second substrate and the second isolation pattern structure; and bonding the first substrate and the second substrate so that the fourth insulating interlayer on the second substrate and the first insulating interlayer on the first substrate face each other.

BRIEF DESCRIPTION OF THE DRAWINGS

The above and other aspects and features will be more apparent from the following description of example embodiments, taken in conjunction with the accompanying drawings, in which.

DETAILED DESCRIPTION

Figure 1:
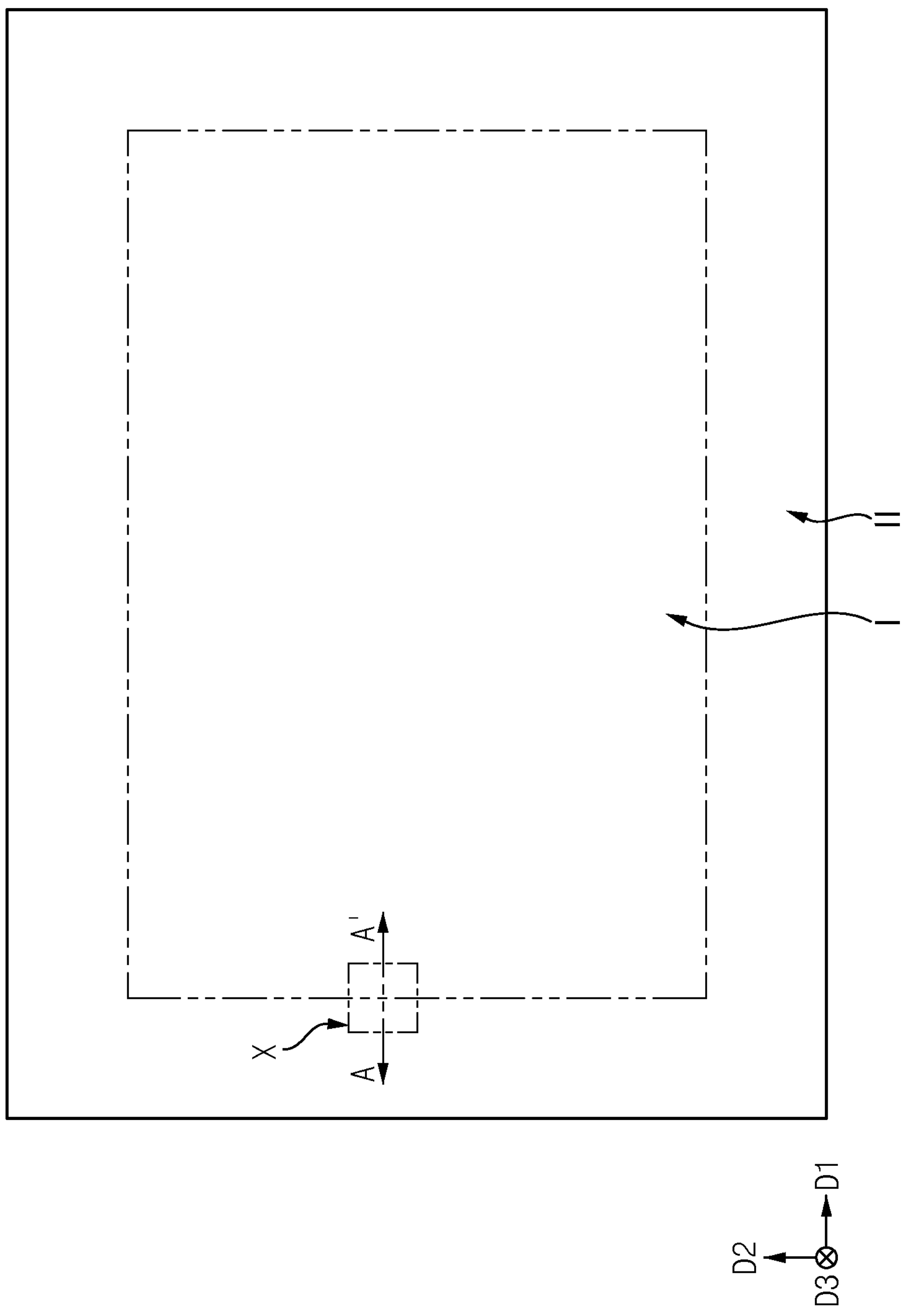
FIG. 1 is a plan view illustrating regions of an image sensor in accordance with example embodiments.

Example embodiments will be described more fully with reference to the accompanying drawings, in which example embodiments are shown. Embodiments described herein are provided as examples, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being “on,” “connected to” or “coupled to” another element or layer, it can be directly on, connected or coupled to the other element or layer, or intervening elements or layers may be present. By contrast, when an element is referred to as being “directly on,” “directly connected to” or “directly coupled to” another element or layer, there are no intervening elements or layers present. Expressions such as “at least one of,” when preceding a list of elements, modify the entire list of elements and do not modify the individual elements of the list. For example, the expression, “at least one of a, b, and c,” should be understood as including only a, only b, only c, both a and b, both a and c, both b and c, or all of a, b, and c. It will be understood that, although the terms “first,” “second,” and/or “third” may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of example embodiments.

First, second and third regions I, II and III may refer to only an inside of a reference substrate, a first substrate, a second substrate and/or a third substrate. Alternatively, the first, second and third regions I, II and III may also refer to spaces over and under the reference substrate, the first substrate, the second substrate and/or the third substrate.

A direction substantially parallel to the reference substrate, the first substrate, the second substrate and/or the third substrate may be referred to as a horizontal direction, and a direction substantially perpendicular to the surface of the reference substrate, the first substrate, the second substrate and/or the third substrate may be referred to as a vertical direction. First and second directions D1 and D2 that cross each other may be referred to as the horizontal directions, and a third direction D3 is used as the vertical direction. First direction D1 and second direction D2 may be substantially perpendicular to one another and substantially perpendicular to the third direction D3.

In the specifications, up vs. down, on and over vs. beneath and under, upper surface vs. lower surface, and upper portion vs. lower portion are relative conceptions so as to describe opposite sides in the vertical direction, and each wording may have opposite meanings according to the specific parts to be explained with reference to example embodiments.

Figure 2A:
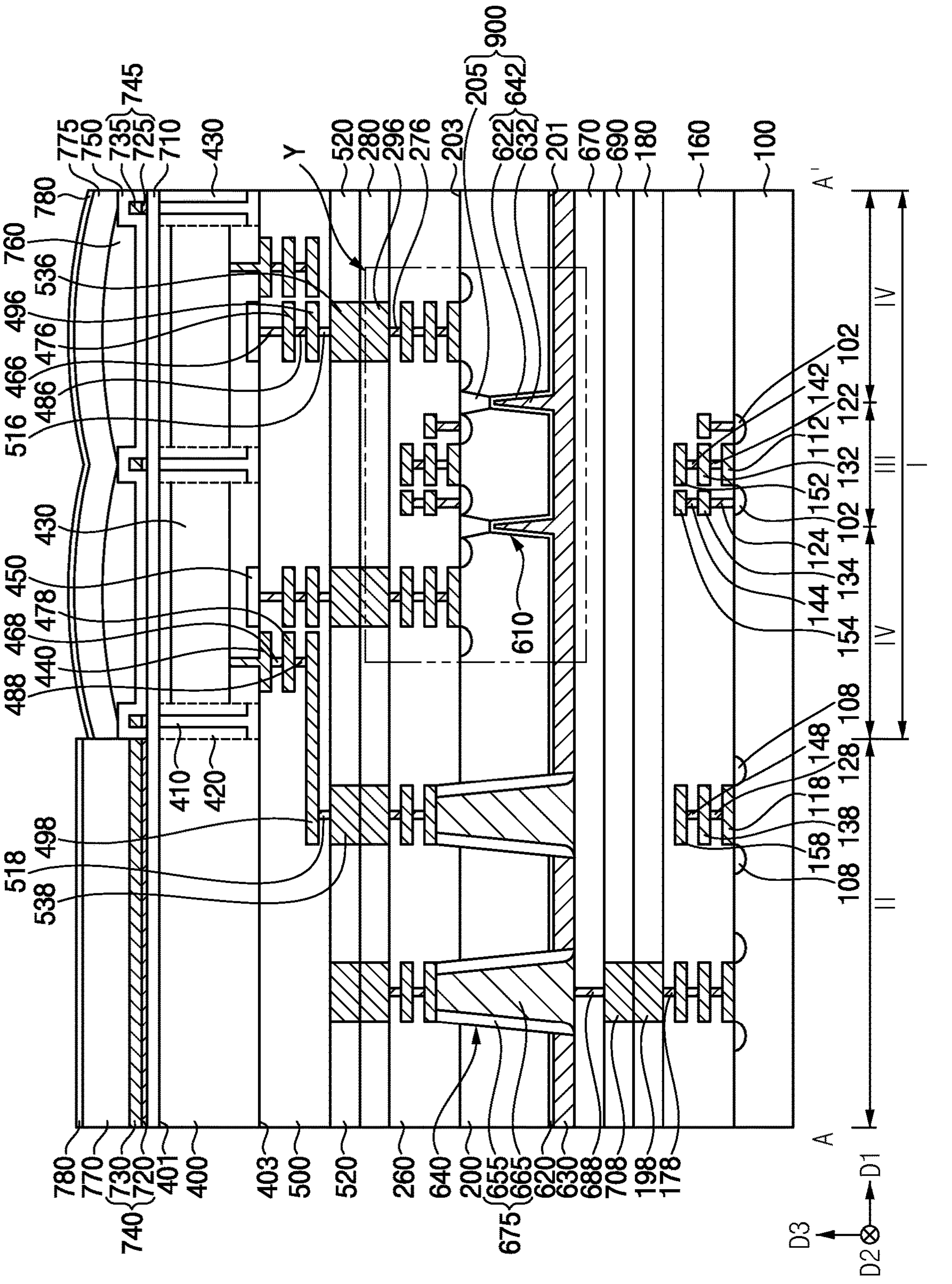
FIGS. 2A and 2B are cross-sectional views illustrating the image sensor.
Figure 2B:
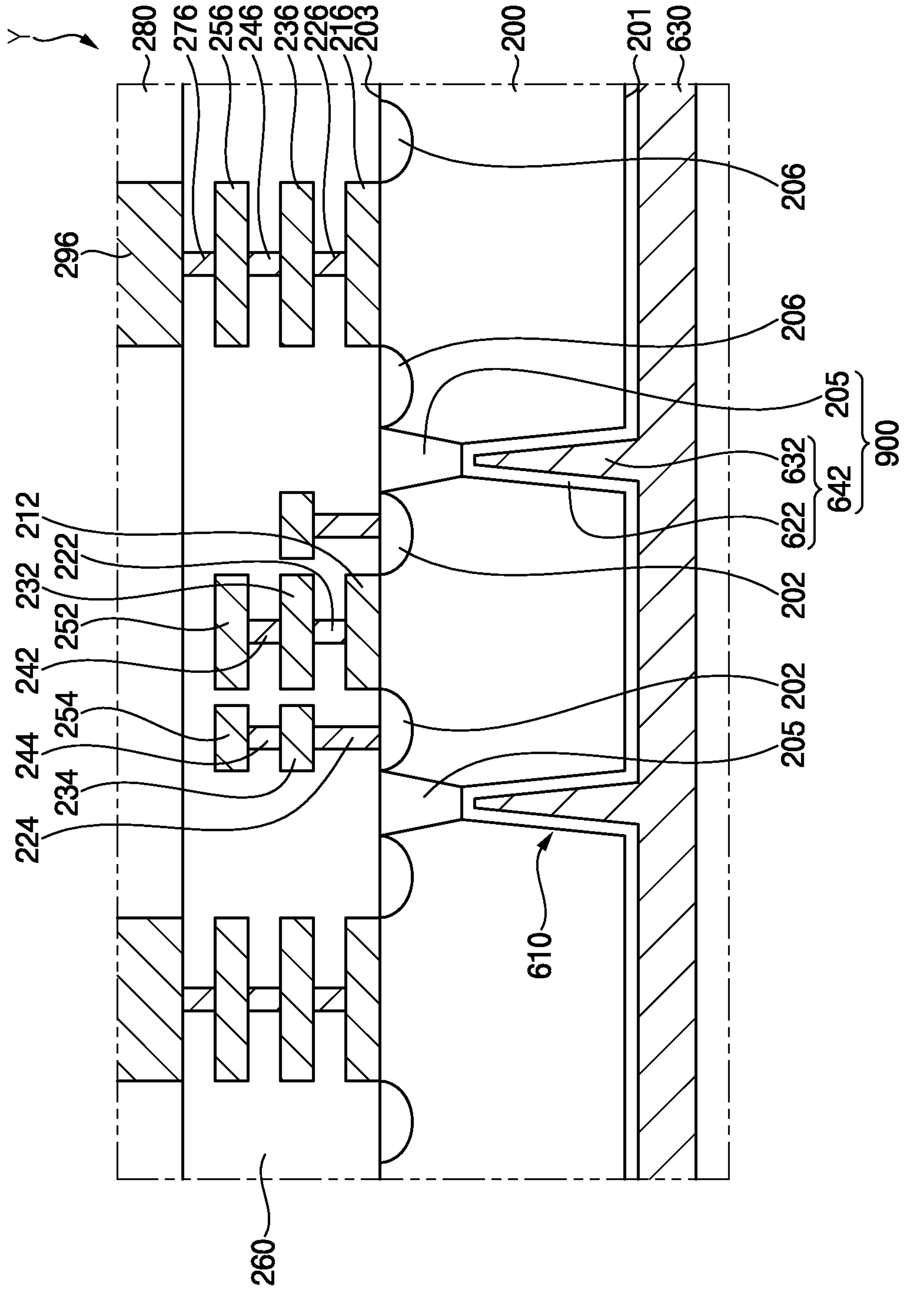
Figure 3:
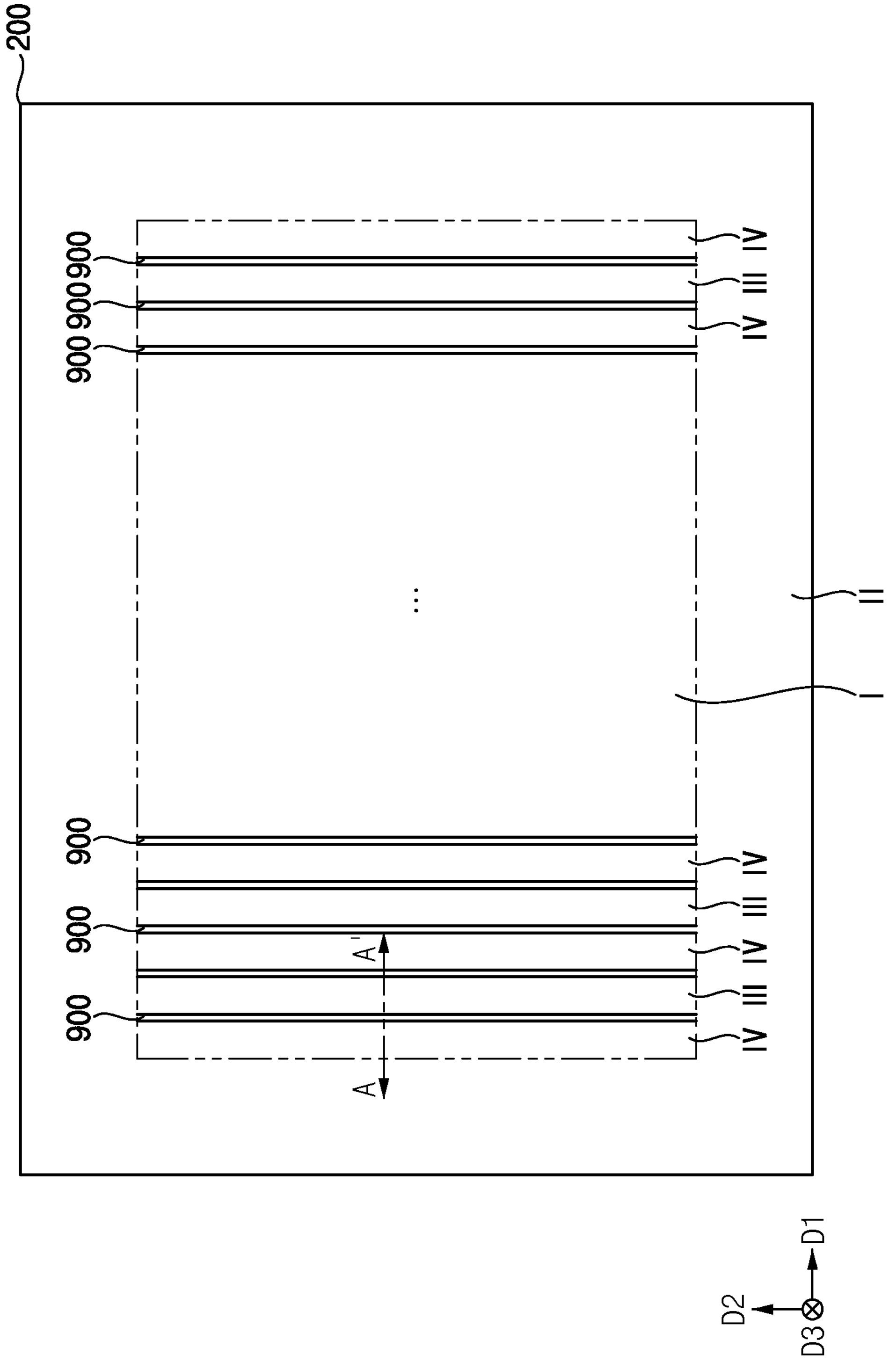
FIGS. 3 and 4 are plan views illustrating a layout of an isolation structure included in the image sensor.
Figure 4:
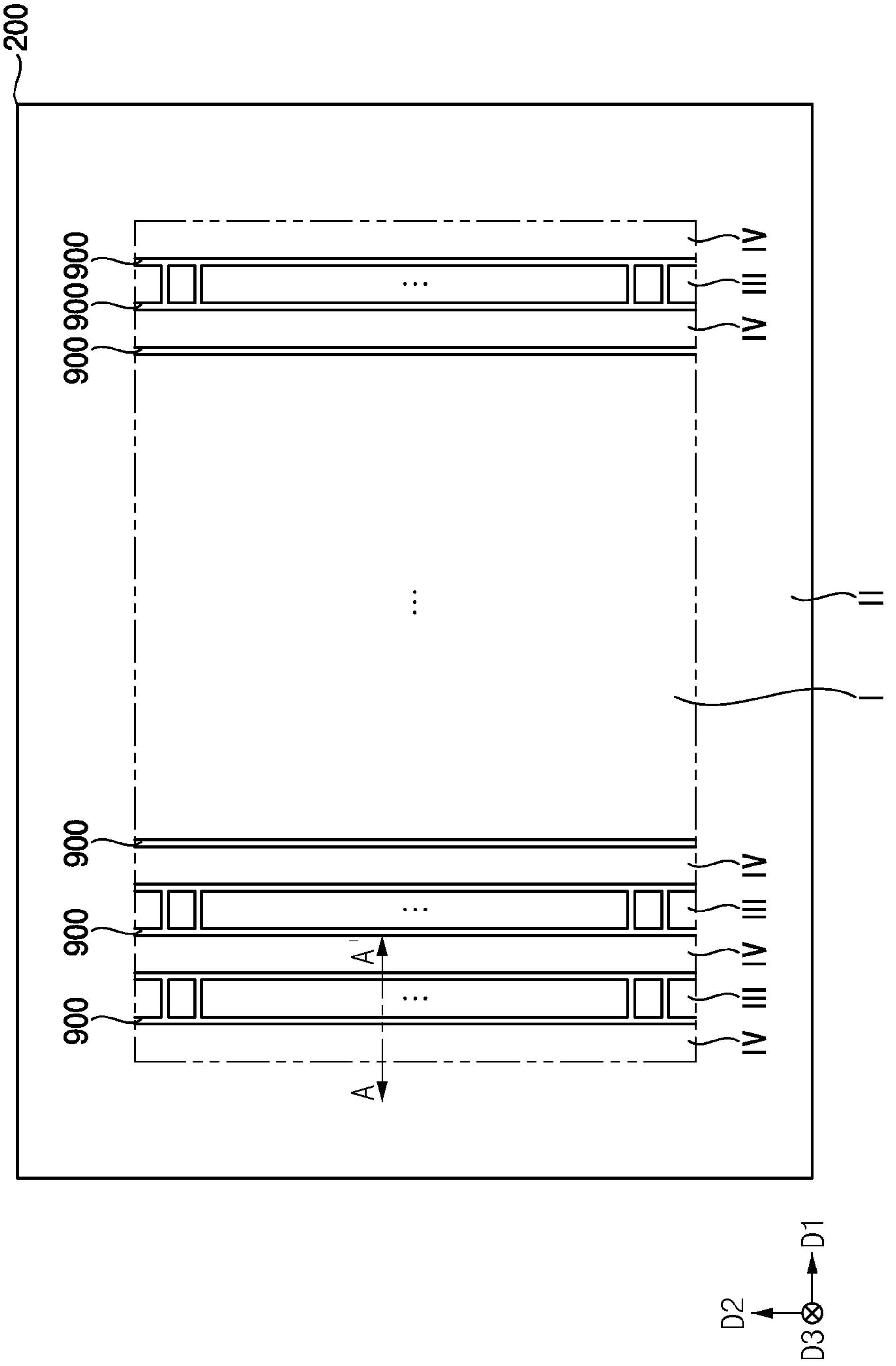

FIG. 1 is a plan view illustrating regions of an image sensor in accordance with example embodiments. FIGS. 2A and 2B are cross-sectional views illustrating the image sensor. FIGS. 3 and 4 are plan views illustrating a layout of an isolation structure included in the image sensor. FIG. 2A is a cross-sectional view taken along line A-A' of region X in FIG. 1, and FIG. 2B is an enlarged cross-sectional view of region Y in FIG. 2A.

Referring to FIG. 1, the image sensor may include first and second regions I and II.

In example embodiments, the first region I may be a pixel region in which pixels are formed, and the second region II may be a connection region in which connection wirings for transferring electrical signals in the vertical direction, that is, the third direction D3 are formed. In example embodiments, the second region II may be around and surround the first region I.

Hereinafter, drawings show only region X in the first and second regions I and II.

Referring to FIGS. 2A and 2B, the image sensor may include first, second and third substrates 100, 200 and 400 sequentially stacked in the third direction D3.

Each of the first, second and third substrates 100, 200 and 400 may include silicon, germanium, silicon-germanium, or a III-V group compound semiconductor, such as GaP, GaAs, or GaSb. In some example embodiments, at least one of the first, second and third substrates 100, 200 and 400 may be a silicon-on-insulator (SOI) substrate or a germanium-on-insulator (GOI) substrate.

In example embodiments, the third substrate 400 may be a substrate on which elements for receiving light and converting the light into electronic signals are formed, the second substrate 200 may be a substrate on which elements for converting the electronic signals into voltage signals are formed, and the first substrate 100 may be a substrate on which logic circuit patterns for processing electrical signals, e.g., the electronic signals, the voltage signals, etc., are formed.

Thus, logic circuit patterns may be formed in the first, second and third regions I, II and III on the first substrate 100, and for example, a first transistor in the first region I of the first substrate 100 and two second transistors in the second region II of the first substrate 100 included as the logic circuit patterns are shown in FIG. 2A. However, the embodiments are not limited thereto, and one or a plurality of transistors may be formed in each of the first and second regions I and II of the first substrate 100.

The first transistor may include a first gate electrode 112 on the first region I of the first substrate 100 and first impurity regions 102 at portions of the first substrate 100 adjacent to the first gate electrode 112, and the second transistor may include a second gate electrode 118 on the second region II of the first substrate 100 and second impurity regions 108 at portions of the first substrate 100 adjacent to the second gate electrode 118.

Contact plugs, wirings and vias electrically connected to the first and second transistors may be further formed on the first substrate 100.

FIG. 2A shows a first contact plug 122, a first wiring 132, a first via 142 and a second wiring 152 sequentially stacked on the first gate electrode 112 included in the first transistor, a second contact plug 124, a third wiring 134, a second via 144 and a fourth wiring 154 sequentially stacked on the first impurity region 102 included in the first transistor, and a third contact plug 128, a fifth wiring 138, a third via 148, a sixth wiring 158 and a fourth via 178 sequentially stacked on the second electrode 118 included in the second transistor, however, embodiments are not limited thereto.

For example, in addition to the first to sixth wirings 132, 152, 124, 154, 138 and 158 at first and second levels, upper wirings may be further formed at one or a plurality of levels higher than the second level.

A first insulating interlayer 160 may be formed on the first substrate 100, and may be provided on the first and second transistors, the first, second and third contact plugs 122, 124 and 128, the first to sixth wirings 132, 152, 134, 154, 138 and 158, and the first to fourth vias 142, 144, 148 and 178. In an example embodiment, first insulating interlayer 160 may be formed on the first substrate 100, and may cover the first and second transistors, the first, second and third contact plugs 122, 124 and 128, the first to sixth wirings 132, 152, 134, 154, 138 and 158, and the first to fourth vias 142, 144, 148 and 178.

In example embodiments, first and fourth adhesion layers 180 and 690 and a fourth insulating interlayer 670 may be stacked in the third direction D3. A first adhesion pad 198 extending through the first adhesion layer 180 to contact the fourth via 178, a sixth adhesion pad 708 extending through the fourth adhesion layer 690 to contact the first adhesion pad 198, and a fifteenth via 688 extending through the fourth insulating interlayer 670 to contact the sixth adhesion pad 708 may be formed.

The second substrate 200 may have first and second surfaces 201 and 203 that may be opposite to each other in the third direction D3. FIGS. 2A and 2B show that the first and second surfaces 201 and 203 are lower and upper surfaces, respectively, of the second substrate 200.

Analog circuit patterns for forming elements that may convert electronic signals into voltage signals and digital circuit patterns for forming memory elements may be formed on the second surface 203 of the second substrate 200, which may be formed on the fourth and third regions IV and III, respectively, of the second substrate 200. That is, the third and fourth regions III and IV of the second substrate 200 may be a digital block region and an analog block region, respectively.

In example embodiments, the analog block and the digital block on the second substrate 200 may be divided by a first isolation structure 900 extending through the second substrate 200.

Referring to FIGS. 1 and 2 together with FIG. 3, in example embodiments, the first isolation structure 900 may extend in the second direction D2 in the first region I of the second substrate 200, and a plurality of first isolation structures 900 may be spaced apart from each other in the first direction D1. Thus, the first region I of the second substrate 200 may be divided into the third and fourth regions III and IV that may be alternately and repeatedly disposed in the first direction D1.

Referring to FIGS. 1 and 2 together with FIG. 4, in example embodiments, the first isolation structure 900 may include a first portion extending in the second direction D2 in the first region I of the second substrate 200, and thus the first region I of the second substrate 200 may be divided into the third and fourth regions III and IV that may be alternately and repeatedly disposed in the first direction D1.

Additionally, the first isolation structure 900 may include second portions, each of which may extend in the first direction to be connected to the first portion, spaced apart from each other in the second direction D2, and thus the third region III of the second substrate 200 may be divided into a plurality of parts in the second direction D2. The first isolation structure 900 may have a ladder shape in the third region III and a boundary between the third and fourth regions III and IV, in a plan view.

The layout of the first isolation structure 900 is not be limited to those of FIGS. 3 and 4, and example embodiments may have various shapes providing for the first isolation structure 900 to divide the third and fourth regions III and IV from each other in the first region I of the second substrate 200.

In example embodiments, the first isolation structure 900 may include a first isolation pattern 205 extending through a portion of the second substrate 200 adjacent to the second surface 203 and a second isolation pattern structure 642 extending through a portion of the second substrate 200 adjacent to the first surface 201 to contact the first isolation pattern 205.

The first isolation pattern 205 may include an oxide, e.g., silicon oxide.

In example embodiments, the second isolation pattern structure 642 may include a first conductive pattern 632 and a first insulation pattern 622 provided on a sidewall and an upper surface of the first conductive pattern 632. In an example embodiment, the second isolation pattern structure 642 may include a first conductive pattern 632 and a first insulation pattern 622 covering a sidewall and an upper surface of the first conductive pattern 632. The first conductive pattern 632 may include a metal, e.g., tungsten, copper, aluminum, etc., and the first insulation pattern 622 may include a metal oxide, e.g., aluminum oxide, hafnium oxide, etc., or silicon oxide, e.g., tetraethyl orthosilicate (TEOS).

In example embodiments, a first insulation layer 620 and a first conductive layer 630 may be stacked in the third direction D3 beneath the first surface 201 of the second substrate 200, which may include materials substantially the same as those of the first insulation pattern 622 and the first conductive pattern 632, respectively, so as to be merged thereto, respectively.

Third and fourth transistors may be formed on the second substrate 203 of the second substrate 200. In example embodiments, the third and fourth transistors may be formed on the third and fourth regions III and IV divided by the first isolation pattern 205 in the first region I of the second substrate 200. However, embodiments are not limited thereto, and one or a plurality of transistors may be formed in the third and fourth regions III and IV of the second substrate 200.

Particularly, the third transistor may include a third gate electrode 212 on the third region III of the second substrate 200 and third impurity regions 202 at upper portions of the second substrate 200 adjacent to the third gate electrode 212. Additionally, the fourth transistor may include a fourth gate electrode 216 on the fourth region IV of the second substrate 200 and fourth impurity regions 206 at upper portions of the second substrate 200 adjacent to the fourth gate electrode 216.

In example embodiments, the fourth transistor may be a source follower (SF) transistor. Additionally, a select transistor and a reset transistor may be further formed on the fourth region IV of the second substrate 200.

In example embodiments, the third transistor may be a transistor that may form a circuit in, e.g., an SRAM device or a DRAM device.

Contact plugs, wirings and vias electrically connected to the third and fourth transistors may be formed on the second substrate 200.

FIG. 2B shows a fourth contact plug 222, a seventh wiring 232, a fifth via 242 and an eighth wiring 252 sequentially stacked on the third gate electrode 212 included in the third transistor, a fifth contact plug 224, a ninth wiring 234, a sixth via 244 and a tenth wiring 254 sequentially stacked on the third impurity region 202 included in the third transistor, and a sixth contact plug 226, an eleventh wiring 236, a seventh via 246, a twelfth wiring 256 and a ninth via 276 sequentially stacked on the fourth gate electrode 216 included in the fourth transistor on the first region I of the second substrate 200.

Additionally, a thirteenth wiring 238, an eighth via 248, a fourteenth wiring 258 and a tenth via 278 may be sequentially stacked on the second region II of the second substrate 200.

However, embodiments are not limited thereto, and in addition to the seventh to fourteenth wirings 232, 252, 234, 254, 236, 256, 238 and 258 at first and second levels, upper wirings may be further formed at one or a plurality levels higher than the second level.

A second insulating interlayer 260 may be formed on the second surface 203 of the second substrate 200, and may be provided on, and in an example embodiment cover, the third and fourth transistors, the fourth to sixth contact plugs 222, 224 and 226, the seventh to fourteenth wirings 232, 252, 234, 254, 236, 256, 238 and 258, and the fifth to tenth vias 242, 244, 246, 248, 276 and 278.

In example embodiments, a first through electrode structure 675 extending through the first conductive layer 630, the first insulation layer 620, the second region II of the second substrate 200 and a lower portion of the second insulating interlayer 260 to contact the thirteenth wiring 238 may be formed.

In example embodiments, the first through electrode structure 675 may include a second conductive pattern 665 and a second insulation pattern 655 provided on, and in an example embodiment covering, a sidewall of the second conductive pattern 665. The second conductive pattern 665 may include a metal, e.g., tungsten, copper, aluminum, etc., and the second insulation pattern 655 may include a metal oxide, e.g., aluminum oxide, hafnium oxide, etc., or silicon oxide, e.g., TEOS.

Second and third adhesion layers 280 and 520 may be stacked on the second insulating interlayer 260 and the ninth and tenth vias 276 and 278. Second and third adhesion pads 296 and 298 extending through the second adhesion layer 280 to contact the ninth and tenth vias 276 and 278, respectively, may be formed on the first and second regions I and II, respectively, of the second substrate 200. Additionally, fourth and fifth adhesion pads 536 and 538 extending through the third adhesion layer 520 to contact the second and third adhesion pads 296 and 298, respectively, may be formed.

A third insulating interlayer 500 may be formed on the third adhesion layer 520, and may contact a lower surface of the third substrate 400. The third substrate 400 may include first and second surfaces 401 and 403 opposite to each other in the third direction D3, and FIG. 2A shows that the first and second surfaces 401 and 403 of the third substrate 400 are upper and lower surfaces, respectively, of the third substrate 400.

In example embodiments, a pixel division structure 410 extending through the third substrate 400 in the third direction D3, a light sensing element 430 in each of unit pixel regions defined by the pixel division structure 410, a transfer gate (TG) 440 extending in the third direction D3 through a lower portion of the third substrate 400 to contact the light sensing element 430 and having a lower portion protruding from the second surface 403 of the third substrate 400 downwardly that may be, in an example embodiment, covered by the third insulating interlayer 500, and a floating diffusion (FD) region 450 at a lower portion of the third substrate 400 adjacent to the TG 440 may be formed in the first region I. In an example embodiment, the third insulating layer 500 may be provided on the lower portion protruding from the second surface 403 of the third substrate 400 downwardly.

In example embodiments, a p-type well including p-type impurities may be formed in the third substrate 400.

The pixel division structure 410 may extend in the third direction D3 from the second surface 403 to the first substrate 401 of the third substrate 400 in an inside of the first region I and at a boundary between the first and second regions I and II.

In example embodiments, the pixel division structure 410 may be arranged in a lattice pattern in a plan view, and unit pixel regions in which unit pixels are formed respectively may be defined by the pixel division structure 410. The unit pixel regions may be arranged in the first and second directions D1 and D2 in the first region I of the third substrate 400.

In example embodiments, the pixel division structure may include a core extending in the third direction D3 and a shell provided on, and in an example embodiment covering, a sidewall of the core. The core may include, e.g., polysilicon doped with impurities or undoped polysilicon, and the shell may include an insulating material, e.g., silicon oxide, silicon nitride, etc.

A fifth impurity region 420 including p-type impurities, e.g., boron may be formed at a portion of the third substrate 400 adjacent to the pixel division structure 410 in the first region I. An impurity concentration of the fifth impurity region 420 may be higher than that of the p-type well.

In example embodiments, the light sensing element 430 may be, for example, a photodiode (PD) or a portion of a photodiode (PD). The light sensing element 430 may be an impurity region doped with n-type impurities, e.g., phosphorus in the p-type well in the first region I of the third substrate 400, and thus the light sensing element 430 and the p-type well may form a PN junction diode. In example embodiments, the light sensing element 430 may be formed in each of the unit pixel regions defined by the pixel division structure 410.

The TG 440 may include a buried portion extending from the second surface 403 of the third substrate 400 in the third direction D3 upwardly and a protrusion portion under the buried portion and having a bottom surface lower than the second surface 403 of the third substrate 400. In example embodiments, the TG 440 may be formed in each of the unit pixel region defined by the pixel division structure 410.

The FD region 450 may be an impurity region doped with n-type impurities, e.g., phosphorus at a lower portion of the third substrate 400 adjacent to the TG 440.

Contact plugs, vias and wirings electrically connected to the TG 440 and the FD region 450 may be formed in the third insulating interlayer 500.

FIG. 2A shows a seventh contact plug 466, a fifteenth wiring 476, an eleventh via 486, a sixteenth wiring 496 and a thirteenth via 516 sequentially stacked on the FD region 450, and an eighth contact plug 468, a seventeenth wiring 478, a twelfth via 488, an eighteenth wiring 498 and a fourteenth via 518 sequentially stacked on the TG 440 on the first region I of the third substrate 400, however, the embodiments are not limited thereto.

One or ones of the wirings, e.g., the eighteenth wiring 498 may extend from the first region I of the third substrate 400 to the second region II of the third substrate 400.

The third insulating interlayer 500 under the second surface 403 of the third substrate 400 may be provided on, and in an example embodiment cover, the TG 440, the FD region 450, the seventh and eighth contact plugs 466 and 468, the fifteenth to eighteenth wirings 476, 496, 478 and 498, and the eleventh to fourteenth vias 486, 488, 516 and 518.

The thirteenth and fourteenth vias 516 and 518 may contact the fourth and fifth adhesion pads 536 and 538, respectively, in the third adhesion layer 520. Thus, the FD region 450 on the third substrate 400 and electrically connected to the thirteenth via 516 may be electrically connected to the fourth transistor on the second substrate 200 through the second and fourth adhesion pads 296 and 536.

The first to fourth gate electrodes 112, 118, 212 and 216, the first to eighth contact plugs 122, 124, 128, 222, 224, 226, 466, 468, the first to fifteenth vias 142, 144, 148, 178, 242, 244, 246, 248, 276, 278, 486, 488, 516, 518, 688, and the first to eighteenth wirings 132, 152, 134, 154, 138, 158, 232, 252, 234, 254, 236, 256, 238, 258, 476, 496, 478, 498 may include a conductive material, e.g., a metal, a metal nitride, a metal silicide, etc., and the first to fourth insulating interlayers 160, 260, 500 and 670 may include an oxide, e.g., silicon oxide.

The first to fourth adhesion layers 180, 280, 520 and 690 may include an insulating nitride, e.g., silicon nitride, and the first to sixth adhesion pads 198, 296, 298, 536, 538 and 708 may include a metal, e.g., copper.

In example embodiments, a lower planarization layer 710 may be formed on the first surface 401 of the third substrate 400 and the pixel division structure 410, a color filter array layer including color filters 760, a microlens 775 and a transparent protection layer 780 may be stacked on the lower planarization layer 710 in the first region I, and a light blocking metal layer 740, an upper planarization layer 770 and the transparent protection layer 780 may be sequentially stacked on the lower planarization layer 710 in the second region II.

An interference blocking structure 745 between color filters 760 included in the color filter array layer, and a protection layer 750 provided on, and in an example embodiment covering, a surface of the interference blocking structure 745 on the lower planarization layer 710 may be formed in the first region I.

In an example embodiment, the lower planarization layer 710 may include first, second, third, fourth and fifth layers sequentially stacked in the third direction D3. The first, second, third, fourth and fifth layers may include, e.g., aluminum oxide, hafnium oxide, silicon oxide, silicon nitride, and hafnium oxide, respectively.

The interference blocking structure 745 may be formed on the lower planarization layer 710 to overlap the pixel division structure 410 in the third direction D3, and may have a lattice shape in a plan view. In example embodiments, the interference blocking structure 745 may include a first interference blocking pattern 725 and a second interference blocking pattern 735 stacked in the third direction D3. The first interference blocking pattern 725 may include a metal nitride, and the second interference blocking pattern 735 may include a metal. Alternatively, the second interference blocking pattern 735 may include a low refractive index material (LRIM).

The protection layer 750 may include a metal oxide, e.g., aluminum oxide.

The color filter array layer may be formed on the protection layer 750, and may include a plurality of color filters 760. A protection layer 750 may be provided on sidewalls and bottom surfaces of the color filters 760. In an embodiment, sidewalls and bottom surfaces of the color filters 760 may be covered by the protection layer 750. For example, the color filters 760 may include a green color filter G, a blue color filter B and a red color filter R, however, embodiments are not limited thereto.

In example embodiments, the light blocking metal layer 740 may include a barrier pattern 720 and a third conductive pattern 730 stacked in the third direction D3. The barrier pattern 720 may include, e.g., a metal nitride, and the third conductive pattern 730 may include, e.g., a metal.

In example embodiments, the microlens 775 and the upper planarization layer 770 may include substantially the same material, e.g., a photoresist material having a high transmittance. The transparent protection layer 780 may include, e.g., SiO, SiOC, SiC, SiCN, etc.

In the image sensor, the first region I of the second substrate 200 may be divided into the third and fourth regions III and IV by the first isolation structure 900 extending through the first region I of the second substrate 200, which may be the digital block and the analog block, respectively. Thus, electric interference between digital circuits and analog circuits in the digital block and the analog block, respectively, may decrease.

For example, impurities are doped into the second substrate 200 to form a well, and the third and fourth regions III and IV of the second substrate 200 may be divided by the formation of the well. However, if the second substrate 200 has a thin thickness, the formation of the well may not be easy. In example embodiments, even if the second substrate 200 has a thin thickness, the first region I of the second substrate 200 may be divided into the third and fourth regions III and IV by forming the first isolation pattern 205 and the second isolation pattern structure 642, as described below with FIGS. 5 to 15.

FIGS. 5 to 15 are cross-sectional views illustrating a method of manufacturing an image sensor in accordance with example embodiments. Particularly, FIGS. 5 to 15 are cross-sectional views taken along line A-A' of region X of FIG. 1.

Figure 5:
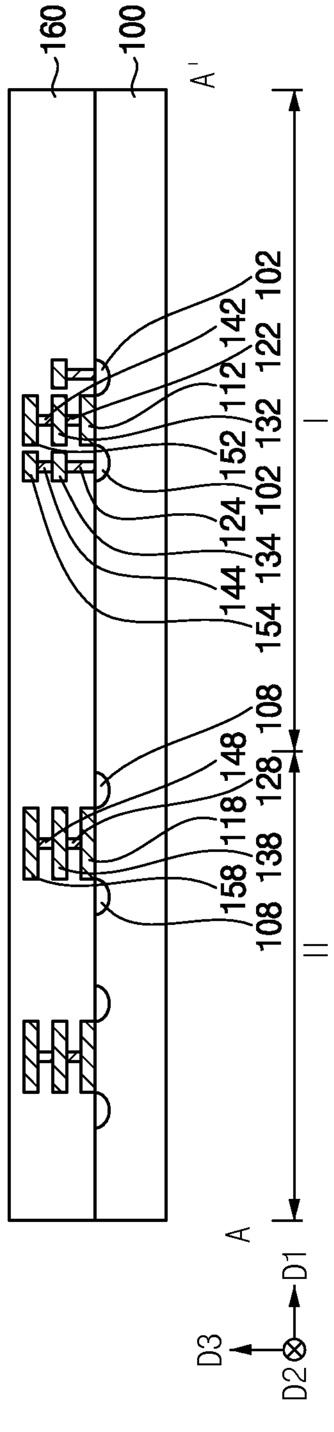
FIGS. 5 to 15 are cross-sectional views illustrating a method of manufacturing an image sensor in accordance with example embodiments.

Referring to FIG. 5, first and second transistors may be formed on first and second regions I and II, respectively, of a first substrate 100.

The first transistor may be formed by forming a first gate electrode 112 on the first region I of the first substrate 100, and doping impurities into upper portions of the first substrate 100 adjacent to the first gate electrode 112 to form first impurity regions 102. Additionally, the second transistor may be formed by forming a second gate electrode 118 on the second region II of the first substrate 100, and doping impurities into upper portions of the first substrate 100 adjacent to the second gate electrode 118 to form second impurity regions 108.

Contact plugs, wirings and vias may be formed to be electrically connected to the first and second transistors.

FIG. 5 shows a first contact plug 122, a first wiring 132, a first via 142 and a second wiring 152 sequentially stacked on the first gate electrode 112 included in the first transistor, a second contact plug 124, a third wiring 134, a second via 144 and a fourth wiring 154 sequentially stacked on the first impurity region 102 included in the first transistor, and a third contact plug 128, a fifth wiring 138, a third via 148 and a sixth wiring 158 sequentially stacked on the second electrode 118 included in the second transistor.

A first insulating interlayer 160 may be formed on the first substrate 100 and be provided on the first and second transistors, the first, second and third contact plugs 122, 124 and 128, the first to sixth wirings 132, 152, 134, 154, 138 and 158, and the first, second and third vias 142, 144 and 148. In an example embodiment, the first insulating interlayer 160 may be formed on the first substrate 100 and cover on the first and second transistors, the first, second and third contact plugs 122, 124 and 128, the first to sixth wirings 132, 152, 134, 154, 138 and 158, and the first, second and third vias 142, 144 and 148.

Figure 6:
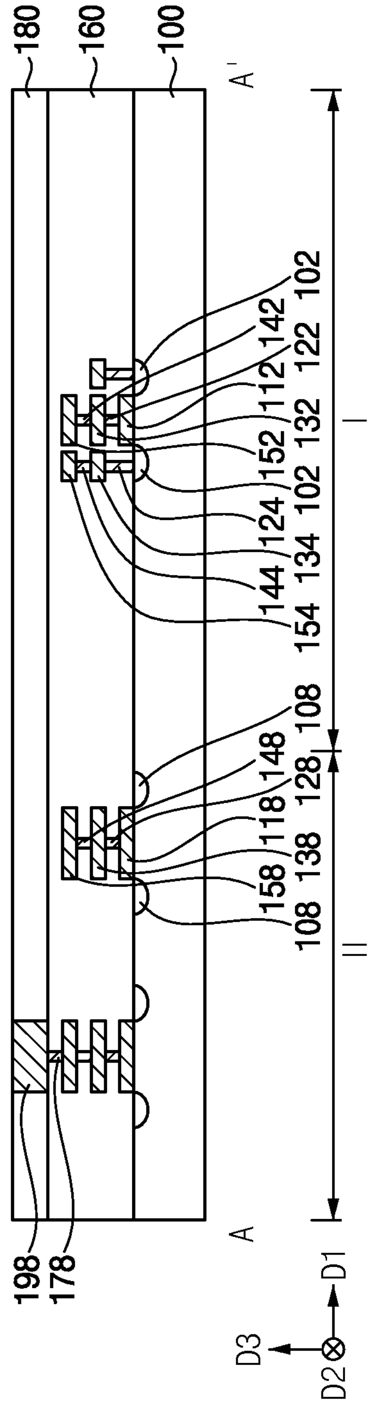

Referring to FIG. 6, a fourth via 178 may be formed through an upper portion of the first insulating interlayer 160 to contact an upper surface of the sixth wiring 158, a first adhesion layer 180 may be formed on the first insulating interlayer 160 and the fourth via 178, and a first adhesion pad 198 may be formed through the first adhesion layer 180 to contact the fourth via 178 on the second region II of the first substrate 100.

Figure 7:
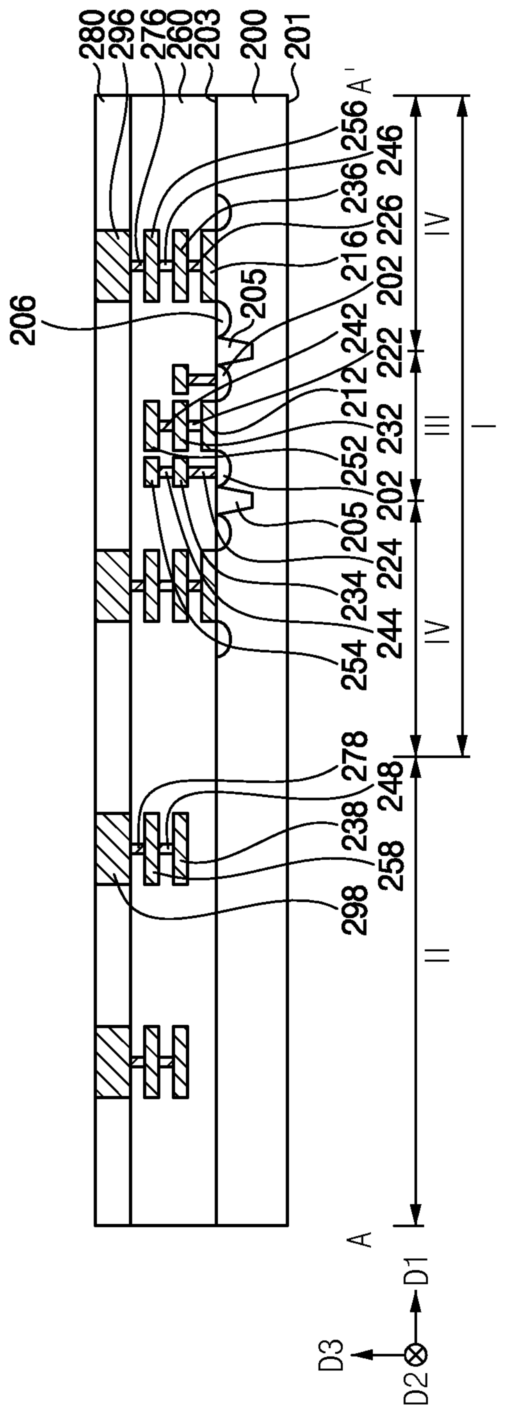

Referring to FIG. 7, an upper portion of the second substrate 200 including first and second surfaces 201 and 203 opposite to each other in the third direction D3, that is, a portion of the second substrate 200 adjacent to the second surface 203 may be removed to form a recess, and a first isolation pattern 205 may be formed in the recess.

Referring to FIG. 7 together with FIG. 3, the first isolation pattern 205 may extend in the second direction D2 in the first region I of the second substrate 200, and a plurality of first isolation patterns 205 may be spaced apart from each other in the first direction D1. Thus, the first region I of the second substrate 200 may be divided into third and fourth regions III and IV alternately and repeatedly arranged in the first direction D1.

Third and fourth transistors may be formed on the first region I of the second substrate 200. In example embodiments, the third and fourth transistors may be formed on the third and fourth regions III and IV, respectively, divided by the first isolation pattern 205 in the first region I of the second substrate 200.

Particularly, the third transistor may be formed by forming a third gate electrode 212 on the third region III of the second substrate 200, and doping impurities into upper portions of the second substrate 200 adjacent to the third gate electrode 212 to form third impurity regions 202. Additionally, the fourth transistor may be formed by forming a fourth gate electrode 216 on the fourth region IV of the second substrate 200, and doping impurities into upper portions of the second substrate 200 adjacent to the fourth gate electrode 216 to form fourth impurity regions 206.

Contact plugs, wirings and vias may be formed to be electrically connected to the third and fourth transistors.

FIG. 7 shows a fourth contact plug 222, a seventh wiring 232, a fifth via 242 and an eighth wiring 252 sequentially stacked on the third gate electrode 212 included in the third transistor, a fifth contact plug 224, a ninth wiring 234, a sixth via 244 and a tenth wiring 254 sequentially stacked on the third impurity region 202 included in the third transistor, and a sixth contact plug 226, an eleventh wiring 236, a seventh via 246 and a twelfth wiring 256 sequentially stacked on the fourth gate electrode 216 included in the fourth transistor on the first region I of the second substrate 200.

Additionally, a thirteenth wiring 238, an eighth via 248 and a fourteenth wiring 258 may be sequentially stacked on the second region II of the second substrate 200.

A second insulating interlayer 260 may be formed on the second surface 203 of the second substrate 200 and provided on the third and fourth transistors, the fourth to sixth contact plugs 222, 224 and 226, the seventh to fourteenth wirings 232, 252, 234, 254, 236, 256, 238 and 258, and the fifth to eighth vias 242, 244, 246 and 248. In an example embodiment, the second insulating interlayer 260 may be formed on the second surface 203 of the second substrate 200 and cover on the third and fourth transistors, the fourth to sixth contact plugs 222, 224 and 226, the seventh to fourteenth wirings 232, 252, 234, 254, 236, 256, 238 and 258, and the fifth to eighth vias 242, 244, 246 and 248.

Ninth and tenth vias 276 and 278 may be formed through an upper portion of the second insulating interlayer 260 to contact upper surfaces of the twelfth and fourteenth wirings 256 and 258, respectively, a second adhesion layer 280 may be formed on the second insulating interlayer 260 and the ninth and tenth vias 276 and 278, and second and third adhesion pads 296 and 298 may be formed through the second adhesion layer 280 to contact the ninth and tenth vias 276 and 278, respectively, on the first and second regions I and II, respectively, of the second substrate 200.

Figure 8:
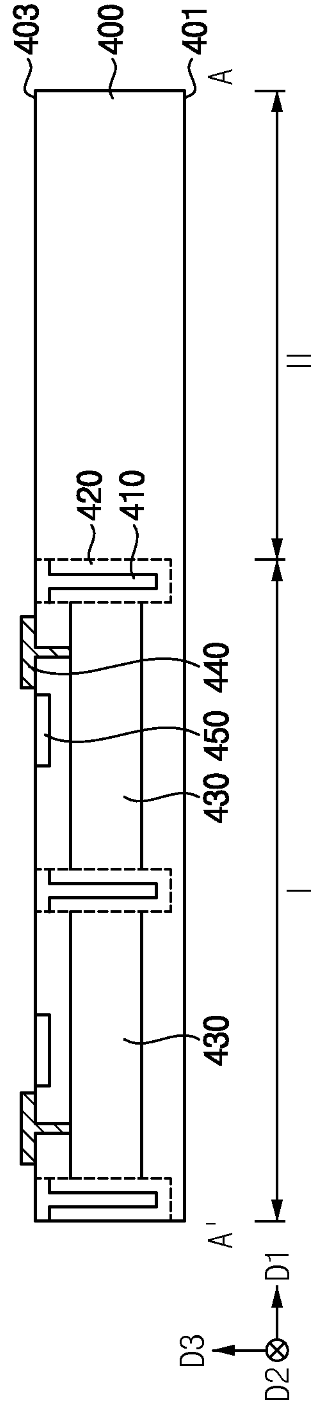

Referring to FIG. 8, a pixel division structure 410, a fifth impurity region 420 and a light sensing element 430 may be formed in the first region I of the third substrate 400 including first and second surfaces 401 and 403 opposite to each other in the third direction D3, and a TG 440 and a FD region 450 may be formed.

In example embodiments, p-type well doped with p-type impurities, e.g., boron may be formed in the third substrate 400.

The pixel division structure 410 may extend in the third direction D3 toward the first surface 401 downwardly in an inside of the first region I and at a boundary between the first and second regions I and II, and the fifth impurity region 420 doped with p-type impurities, e.g., boron may be formed at a portion of the third substrate 400 adjacent to the pixel division structure 410. An impurity concentration of the fifth impurity region 420 may be higher than an impurity concentration of the p-type well.

In example embodiments, the pixel division structure 410 may have a shape of a polygon, e.g., a rectangle, in a plan view, and thus unit pixel regions in which unit pixels are formed, which may be surrounded by the pixel division structure 410, may be defined in the first region I of the third substrate 400.

The light sensing element 430 may be formed by doping n-type impurities, e.g., phosphorus into the p-type well in the first region I of the third substrate 400.

The TG 440 may be formed by forming a trench extending in the third direction D3 from the second surface 403 of the third substrate 400 downwardly, and filling a conductive material in the trench to protrude from the second surface 403 of the third substrate 400 upwardly.

N-type impurities, e.g., phosphorus may be doped into an upper portion of the third substrate 400 adjacent to the TG 440 to form an FD region 450.

Figure 9:
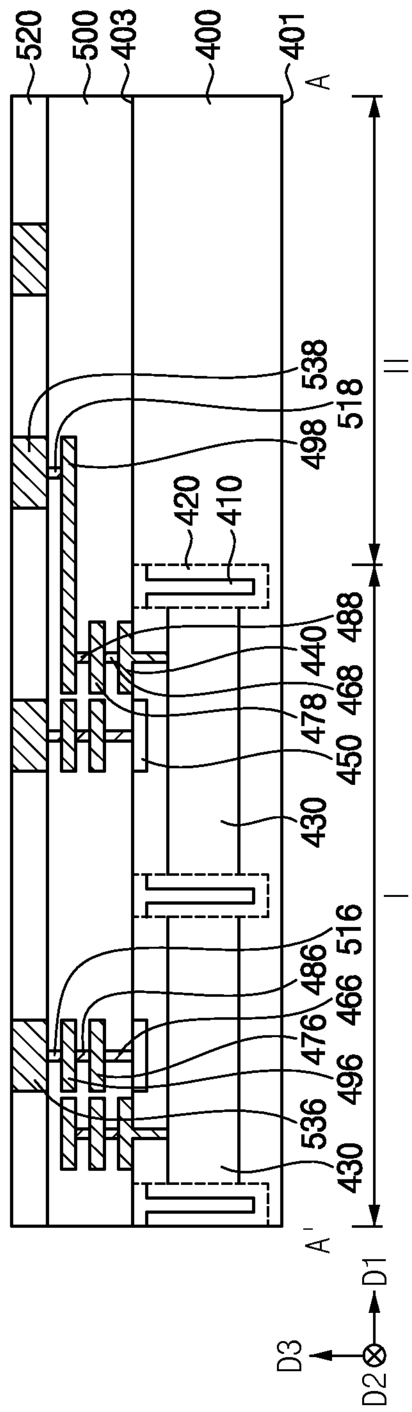

Referring to FIG. 9, contact plugs, wirings and vias electrically connected to the TG 440 and the FD region 450 may be formed.

FIG. 9 shows a seventh contact plug 466, a fifteenth wiring 476, an eleventh via 486 and a sixteenth wiring 496 sequentially stacked on the FD region 450, and an eighth contact plug 468, a seventeenth wiring 478, a twelfth via 488 and an eighteenth wiring 498 sequentially stacked on the TG 440 on the first region I of the third substrate 400.

One or ones of the wirings, e.g., the eighteenth wiring 498 may extend from the first region I of the third substrate 400 to the second region II of the third substrate 400.

A third insulating interlayer 500 may be formed on the second surface 403 of the third substrate 400 and provided on, and in an example embodiment covering, the TG 440, the FD region 450, the seventh and eighth contact plugs 466 and 468, the fifteenth to eighteenth wirings 476, 496, 478 and 498, and the eleventh and twelfth vias 486 and 488.

Thirteenth and fourteenth vias 516 and 518 may be formed through an upper portion of the third insulating interlayer 500 to contact upper surfaces of the sixteenth and eighteenth wirings 496 and 498, respectively, a third adhesion layer 520 may be formed on the third insulating interlayer 500 and the thirteenth and fourteenth vias 516 and 518, and fourth and fifth adhesion pads 536 and 538 may be formed through the third adhesion layer 520 to contact the thirteenth and fourteenth vias 516 and 518, respectively, on the first and second regions I and II, respectively, of the third substrate 400.

Figure 10:
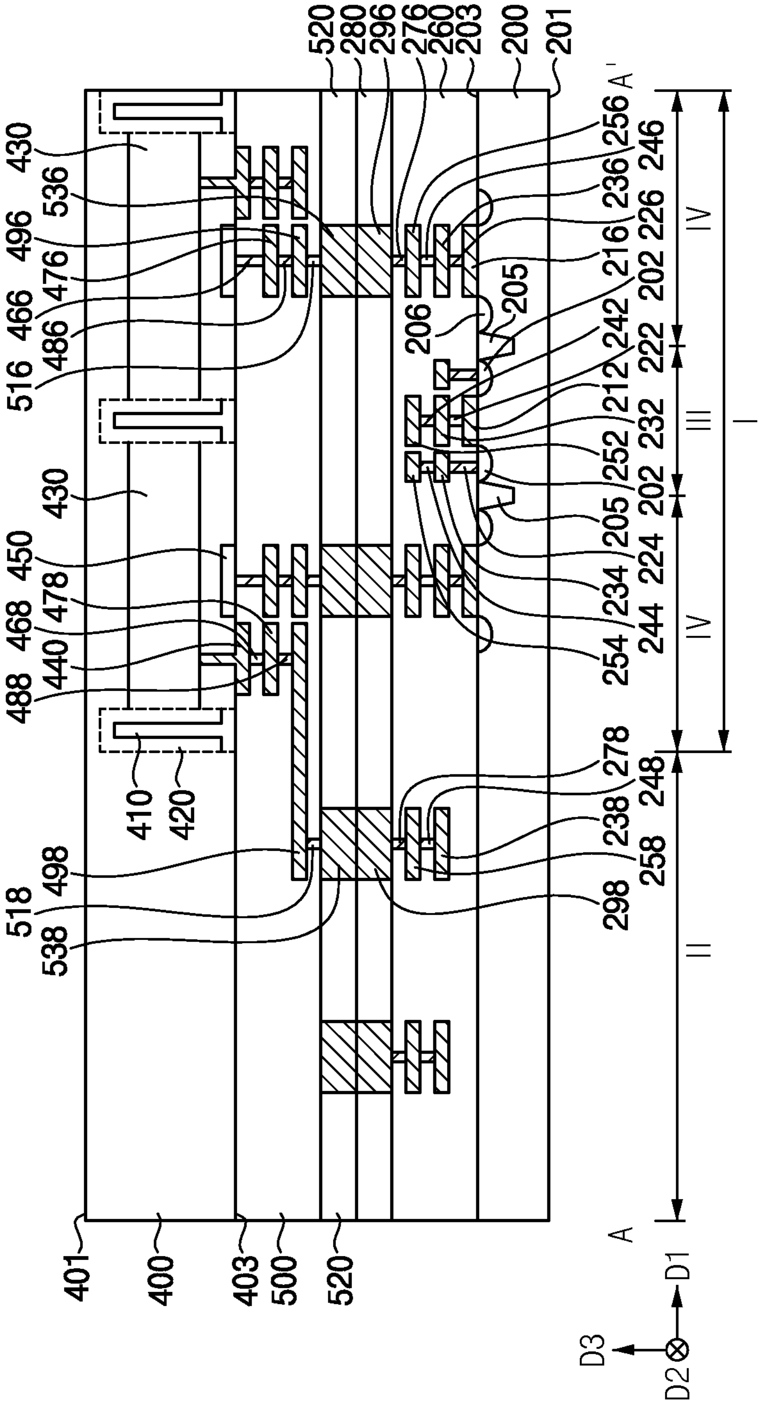

Referring to FIG. 10, the third substrate 400 may be overturned, and the second and third substrates 200 and 400 may be bonded with each other so that the third adhesion layer 520 and the second adhesion layer 280 may contact each other, and during the bonding, the fourth and fifth adhesion pads 536 and 538 may contact the second and third adhesion pads 296 and 298, respectively.

Figure 11:
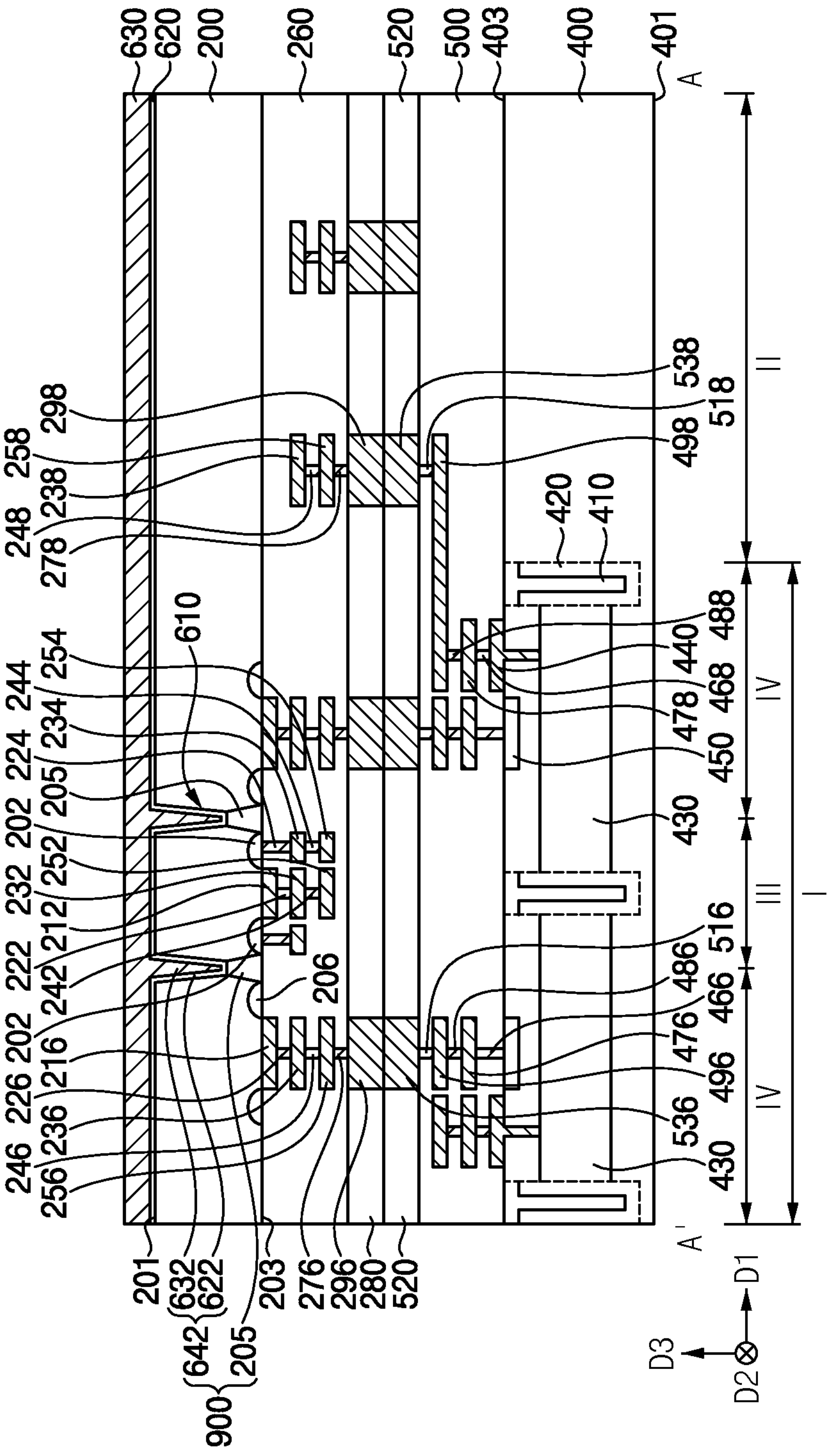

Referring to FIG. 11, the second and third substrates 200 and 400 bonded with each other may be overturned again, and an upper portion of the first region I of the second substrate 200, that is, a portion of the second substrate 200 adjacent to the first surface 201 may be removed to form a first opening 610 exposing an upper surface of the first isolation pattern 205.

A first insulation layer 620 may be formed on the upper surface of the first isolation pattern 205 exposed by the first opening 610, a sidewall of the first opening 610 and the first surface 201 of the second substrate 200, and a first conductive layer 630 may be formed on the first insulation layer 620 to fill the first opening 610.

Hereinafter, portions of the first insulation layer 620 and the first conductive layer 630 in the first opening 620 may be referred to as a first insulation pattern 622 and a first conductive pattern 632, respectively, which may form a second isolation pattern structure 642. Additionally, the first isolation pattern 205 and the second isolation pattern structure 642 stacked in the third direction D3 in the first region I of the second substrate 200 may form a first isolation structure 900.

The first region I of the second substrate 200 may be divided into third and fourth regions III and IV by the first isolation structure 900 in the first region I of the second substrate 200.

Figure 12:
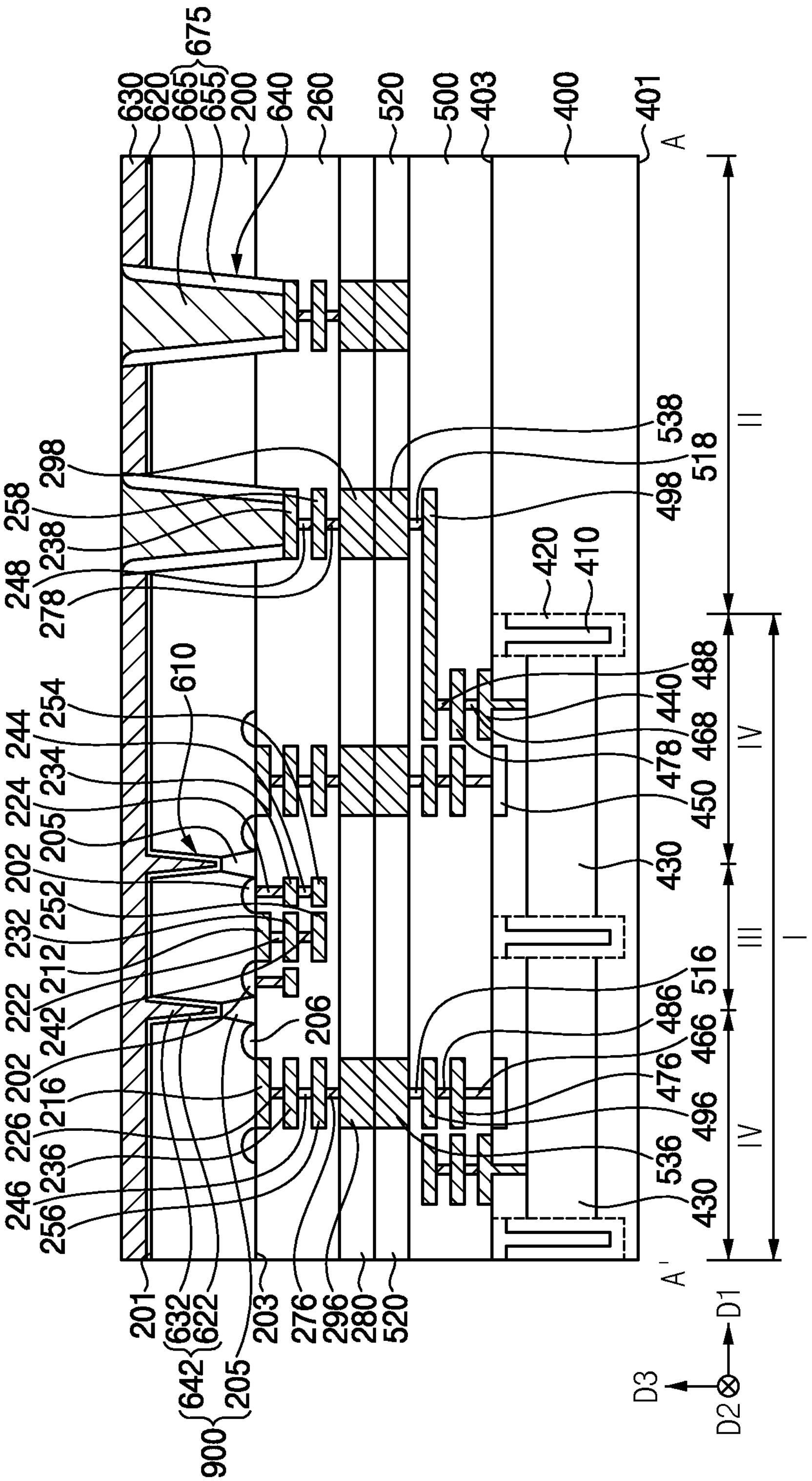

Referring to FIG. 12, a second opening 640 may be formed through portions of the first conductive layer 630 and the first insulation layer 620 on the first surface 201 of the second substrate 200, the second substrate 200 and an upper portion of the second insulating interlayer 260 to expose an upper surface of the thirteenth wiring 238.

A second insulation layer may be formed on the upper surface of the thirteenth wiring 238 exposed by the second opening 640, a sidewall of the second opening 640 and an upper surface of the first conductive layer 630, and may be partially removed by an anisotropic etching process. Thus, a second insulation pattern 655 may be formed on the sidewall of the second opening 640.

A second conductive layer may be formed on the thirteenth wiring 238, a sidewall and an upper surface of the second insulation pattern 655 to fill the second opening 640, and an upper portion of the second conductive layer may be planarized until the upper surface of the first conductive layer 630 is exposed. Thus, a second conductive pattern 665 may be formed in the second opening 640.

The second insulation pattern 655 and the second conductive pattern 665 may form a first through electrode structure 675.

Figure 13:
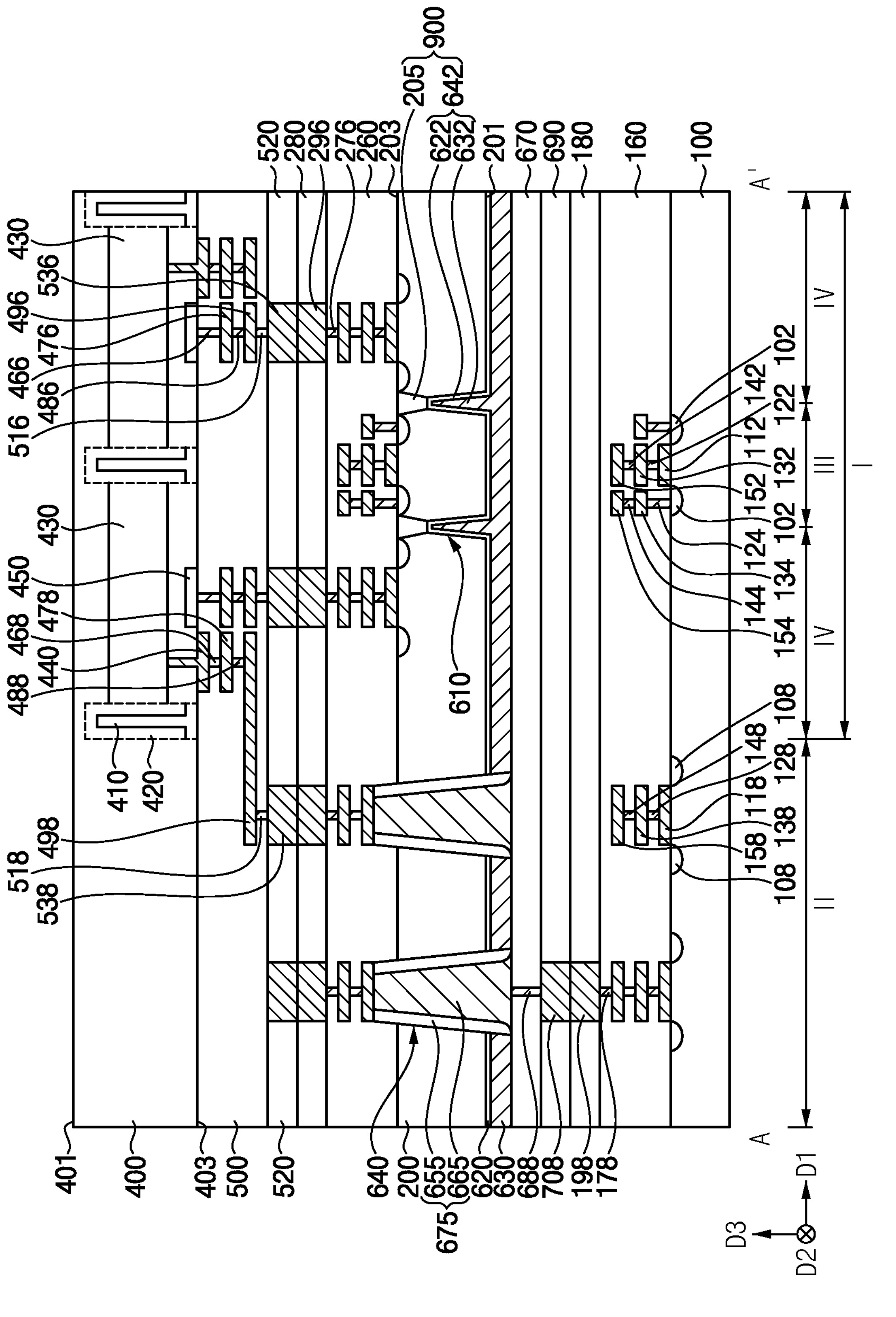

Referring to FIG. 13, a fourth insulating interlayer 670 may be formed on the first conductive layer 630 and the first through electrode structure 675, and a fifteenth via 688 may be formed through the fourth insulating interlayer 670 to contact the second conductive pattern 665.

A fourth adhesion layer 690 may be formed on the fourth insulating interlayer 670 and the fifteenth via 688, and a sixth adhesion pad 708 may be formed through the fourth adhesion layer 690 to contact the fifteenth via 688.

The second and third substrates 200 and 400 bonded with each other may be overturned again, and the first and second substrates 100 and 200 may be bonded with each other so that the fourth adhesion layer 690 may contact the first adhesion layer 180, and during the bonding, the sixth adhesion pad 708 may contact the first adhesion pad 198.

Figure 14:
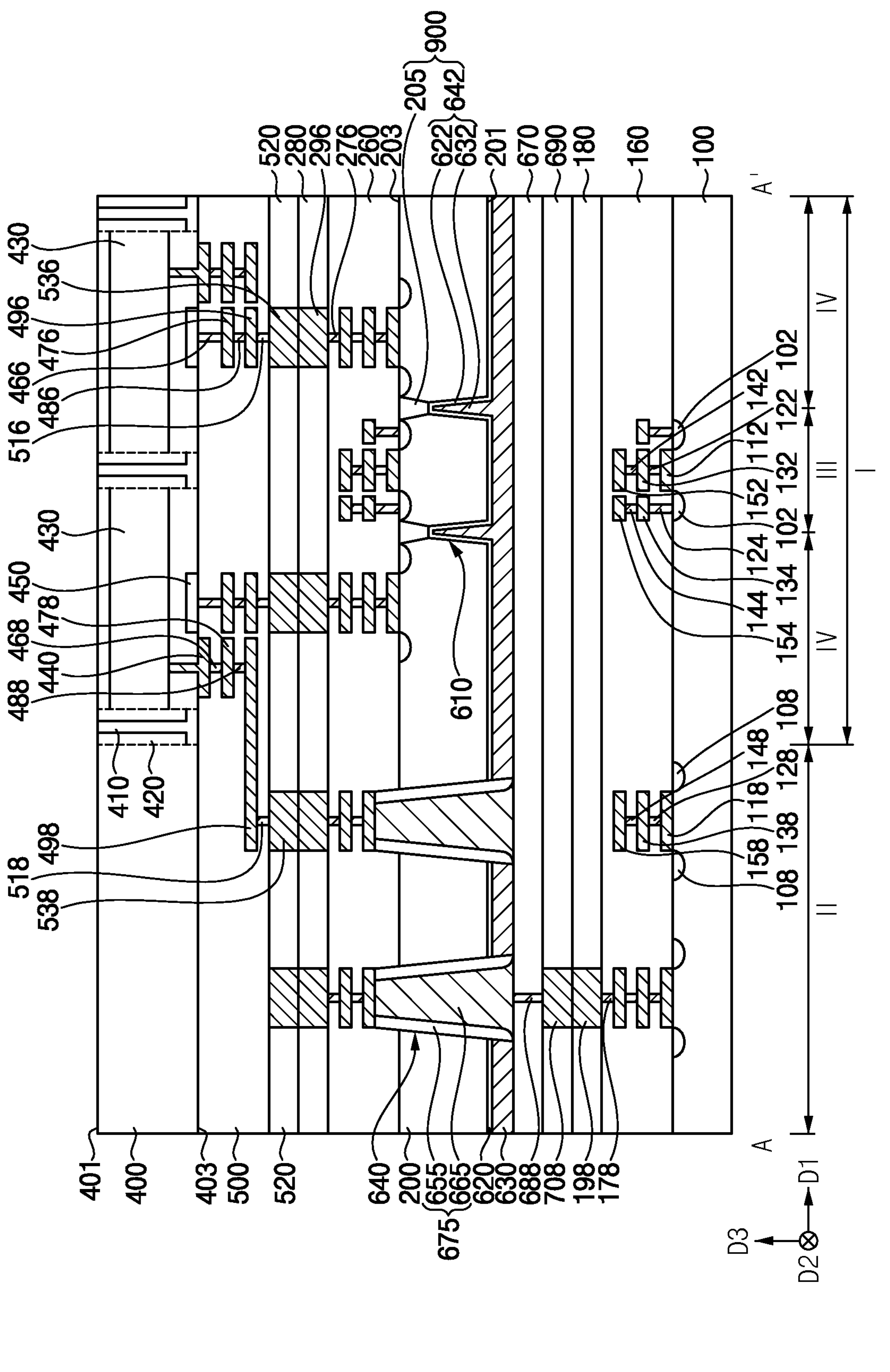

Referring to FIG. 14, an upper portion of the third substrate 400, that is, a portion of the third substrate 400 adjacent to the first surface 401 may be removed.

Thus, an upper surface of the pixel division structure 410 may be exposed, and as a result, the pixel division structure 410 may extend through the third substrate 400.

In example embodiments, the upper portion of the third substrate 400 may be performed by a polishing process, e.g., a grinding process, a chemical mechanical polishing (CMP) process, etc.

Figure 15:
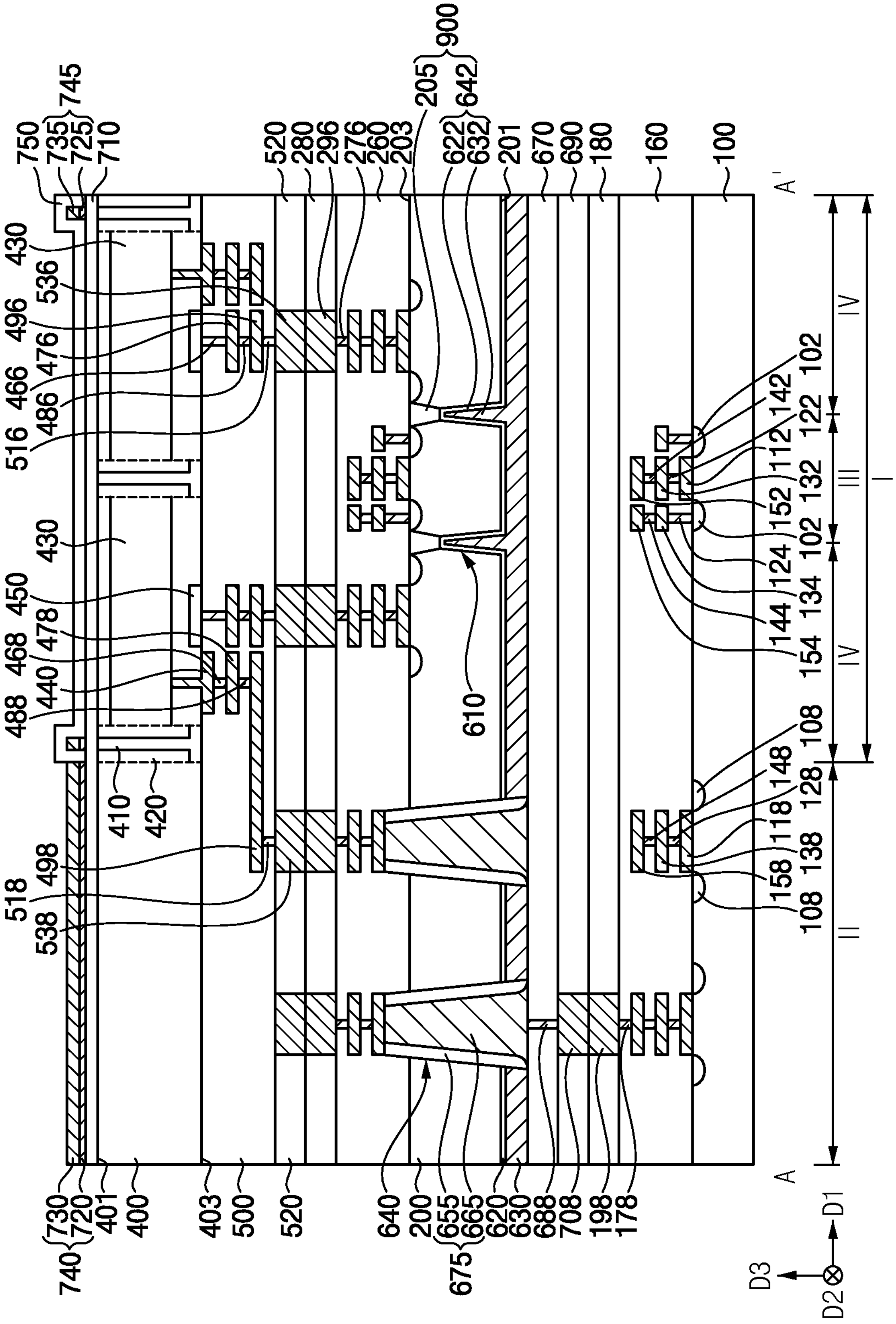

Referring to FIG. 15, a lower planarization layer 710 may be formed on the first surface 401 of the third substrate 400 and the pixel division structure 410.

A barrier layer and a third conductive layer may be sequentially formed on an upper surface of the lower planarization layer 710, and portions of the third conductive layer and the barrier layer in the first region I may be patterned to form a second interference blocking pattern 735 and a first interference blocking pattern 725, respectively, and portions of the barrier layer and the third conductive layer in the second region II may remain as a barrier pattern 720 and a third conductive pattern 730, respectively.

The barrier pattern 720 and the third conductive pattern 730 may form a light blocking metal layer 740, and the first and second interference blocking patterns 725 and 735 may form an interference blocking structure 745.

A protection layer 750 may be formed on the lower planarization layer 710 and the interference blocking structure 745 in the first region I.

Referring to FIG. 2 again, a color filter array layer including color filters 760 may be formed on the protection layer 750 in the first region I.

In example embodiments, the color filters 760 may be formed by depositing a color filter layer on the protection layer 750 and the light blocking metal layer 740 through, e.g., a spin coating process, and performing an exposure process and a developing process on the color filter layer. In an example embodiment, each of the color filters 760 may be formed on each of the unit pixel regions defined by the pixel division structure 410. Alternatively, each of the color filters 760 may be formed on neighboring ones of the unit pixel regions.

An upper planarization layer 770 may be formed on the color filter array layer, the protection layer 750 and the light blocking metal layer 740, and a patterning process and a reflow process may be performed on the upper planarization layer 770 in the first region I to form a microlens 775.

A transparent protection layer 780 may be formed on the microlens 775 and the upper planarization layer 770 to complete the fabrication of the image sensor.

As illustrated above, in the first region I of the second substrate 200, the portion of the second substrate 200 adjacent to the second surface 203 may be removed to form the recess, the first isolation pattern 205 may be formed to fill the recess, the portion of the second substrate 200 adjacent to the first surface 201 may be removed to form the first opening 610, and the second isolation pattern structure 642 may be formed to fill the first opening 610.

Thus, the first region I of the second substrate 200 may be divided into the third and fourth regions III and IV to be electrically insulated from each other by the first isolation structure 900 including the first isolation pattern 205 and the second isolation pattern structure 642 stacked in the third direction D3.

Figure 16A:
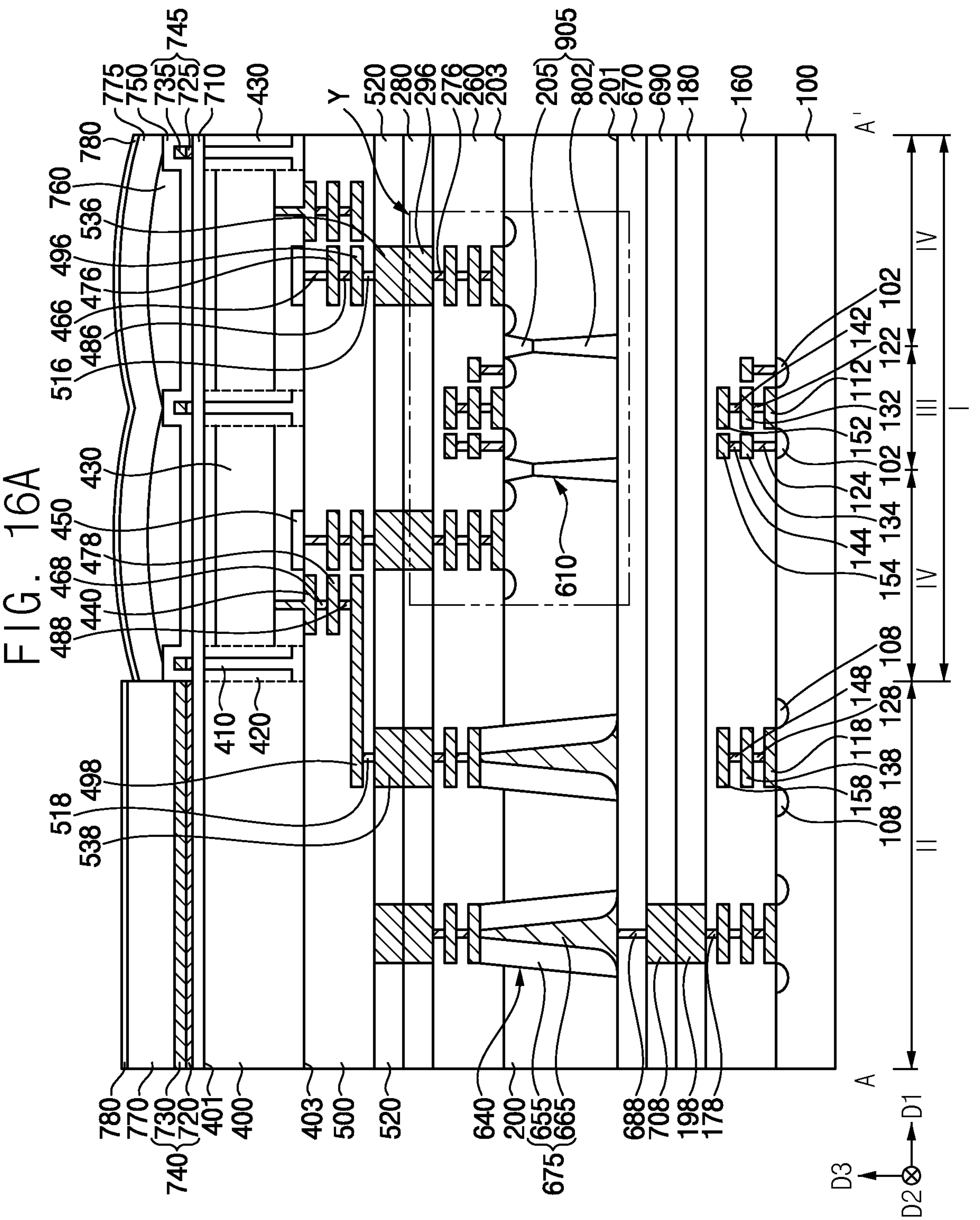
FIGS. 16A and 16B are cross-sectional views illustrating an image sensor in accordance with example embodiments.
Figure 16B:
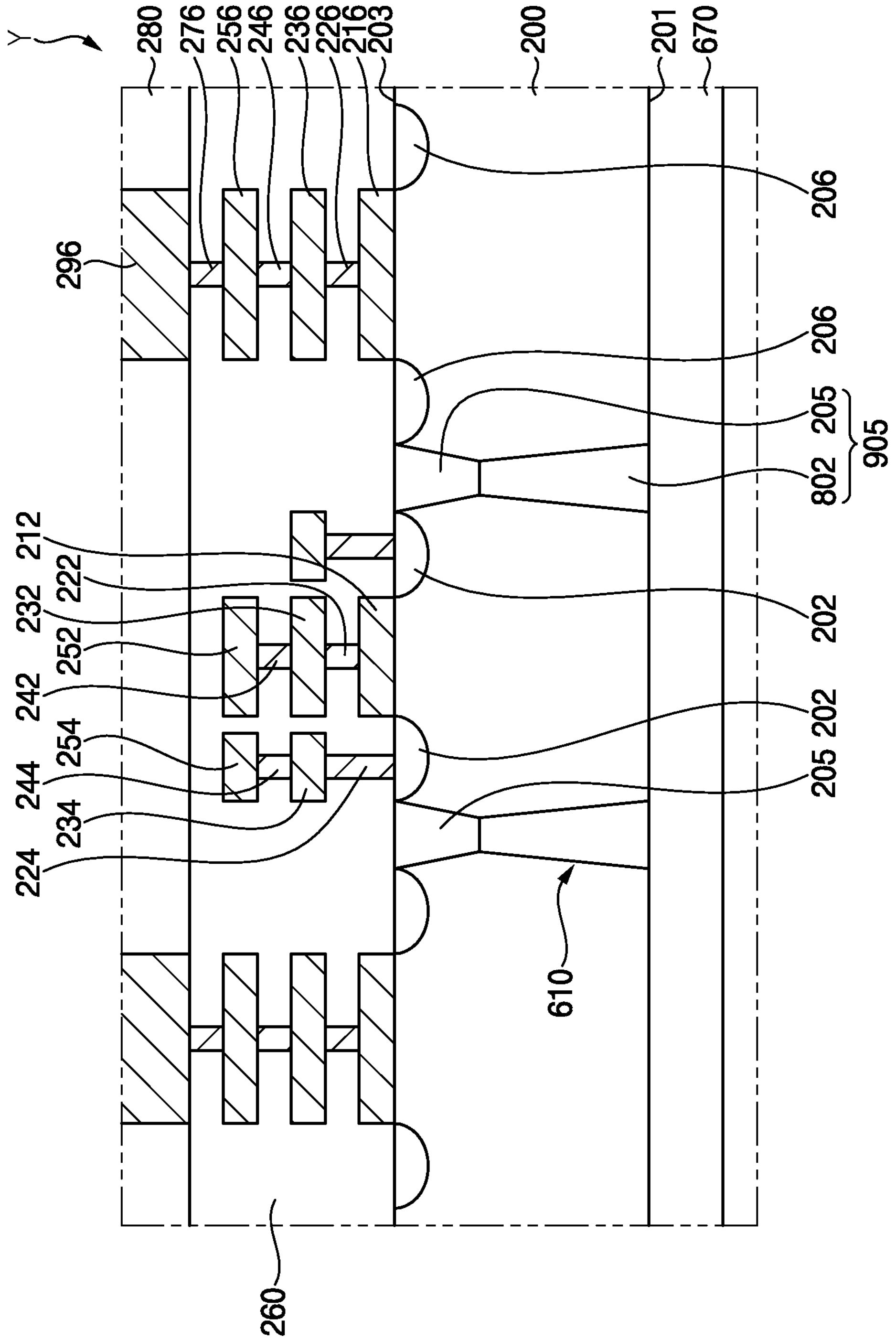

FIGS. 16A and 16B are cross-sectional views illustrating an image sensor in accordance with example embodiments, and FIG. 16B is an enlarged cross-sectional view of region Y of FIG. 16A. This image sensor may be substantially the same as or similar to that of FIGS. 2A and 2B, except for some elements, and thus, repeated explanations thereof are omitted herein.

Referring to FIGS. 16A and 16B, the image sensor may include a second isolation structure 905 instead of the first isolation structure 900 shown in FIGS. 2A and 2B.

In example embodiments, the second isolation structure 905 may further include a third insulation pattern 802 in the first opening 610 in addition to the first isolation pattern 205, and the third insulation pattern 802 may also be referred to as a third isolation pattern.

The third isolation pattern 802 may include a metal oxide, e.g., aluminum oxide, hafnium oxide, etc., or silicon oxide, e.g., TEOS. In example embodiments, the third isolation pattern 802 may include a material substantially the same as that of the second insulation pattern 655 included in the first through electrode structure 675.

Figure 17:
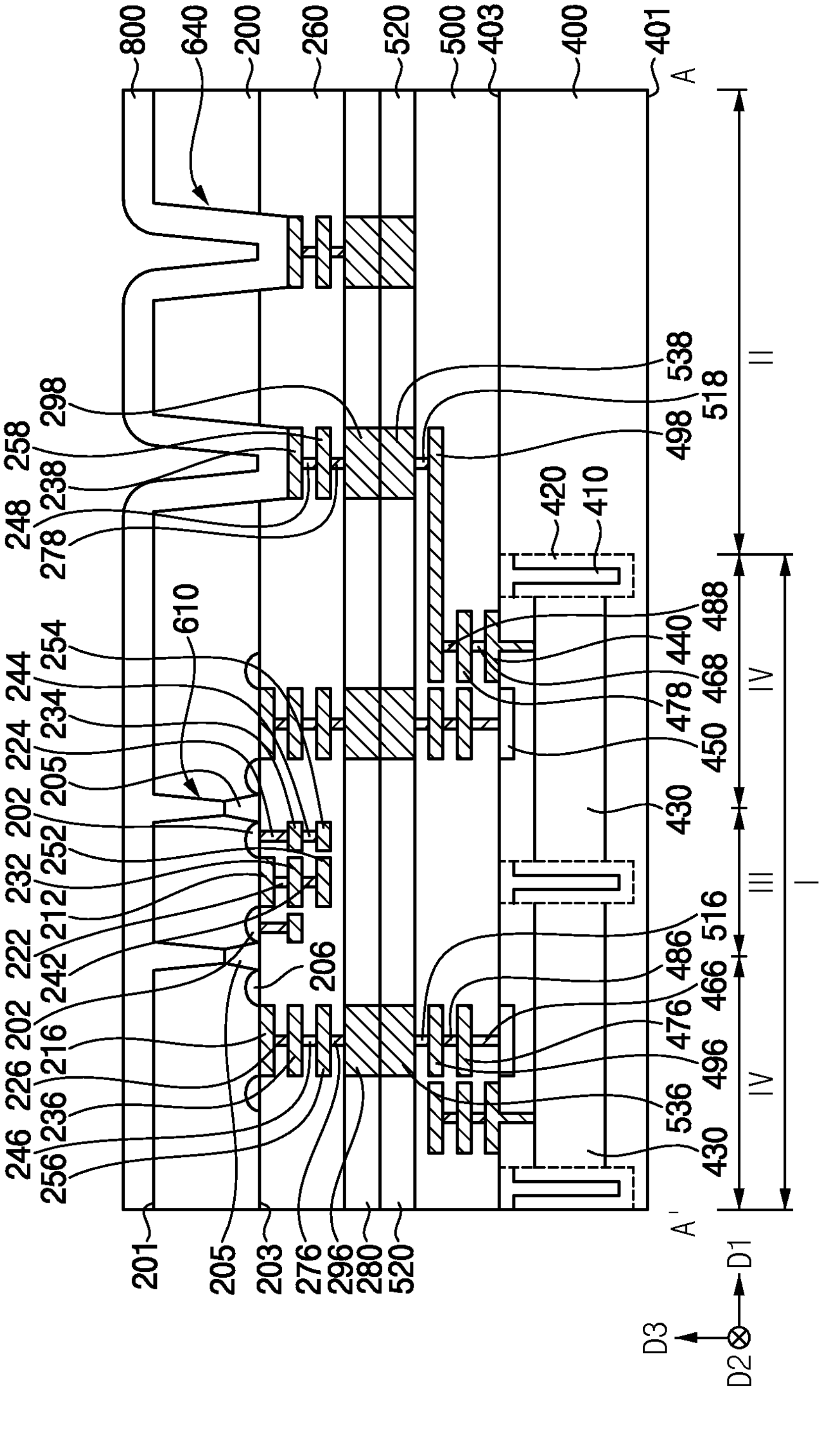
FIGS. 17 and 18 are cross-sectional views illustrating a method of manufacturing an image sensor in accordance with example embodiments.
Figure 18:
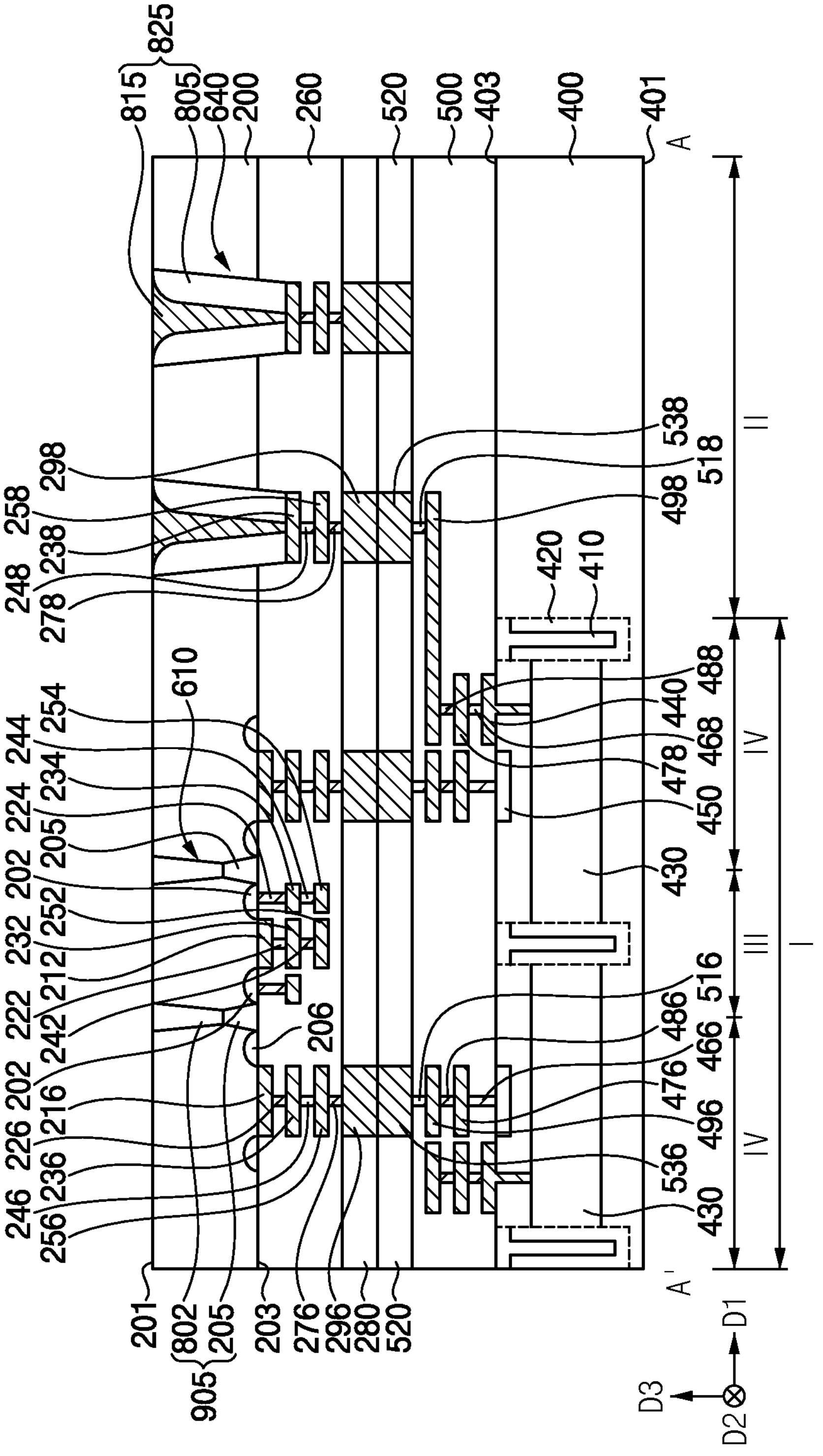

FIGS. 17 and 18 are cross-sectional views illustrating a method of manufacturing an image sensor in accordance with example embodiments. This method may include processes substantially the same as or similar to those illustrated with reference to FIGS. 5 to 15 and FIGS. 1 and 2, and thus repeated explanations thereof are omitted herein.

Referring to FIG. 17, processes substantially the same as or similar to those illustrated with reference to FIGS. 5 to 10 may be performed.

The second and third substrates 200 and 400 bonded with each other may be overturned, the portion of the first region I of the second substrate 200 adjacent to the first surface 201 may be removed to form the first opening 610 exposing the upper surface of the first isolation pattern 205, and the second opening 640 may be formed through the second region II of the second substrate 200 and an upper portion of the second insulating interlayer 260 to expose the upper surface of the thirteenth wiring 238.

A third insulation layer 800 may be formed on the upper surfaces of the first isolation pattern 205 and the thirteenth wiring 238, the sidewalls of the first and second openings 610 and 640, and the first surface 201 of the second substrate 200.

In example embodiments, the first opening 610 may have a width less than that of the second opening 640, and the third insulation layer 800 may entirely fill the first opening 610, but may be formed only on the sidewall of the second opening 640.

Referring to FIG. 18, the third insulation layer 800 may be anisotropically etched, so that a portion of the third insulation layer 800 on the first surface 201 of the second substrate 200 may be removed to form a third insulation pattern 802 in the first opening 610. The third insulation pattern 802 may also be referred to as a third isolation pattern. The first and third isolation patterns 205 and 802 may form a second isolation structure 905.

Additionally, a portion of the third insulation layer 800 on the upper surface of the thirteenth wiring 238 may be removed to form a fourth insulation pattern 805 on the sidewall of the second opening 640.

A fourth conductive layer may be formed on the upper surface of the thirteenth wiring 238, a sidewall and an upper surface of the fourth insulation pattern 805, the first surface 201 of the second substrate 200 and an upper surface of the third insulation pattern 802 to fill the second opening 640, and the fourth conductive layer may be planarized until the first surface 201 of the second substrate 200 is exposed to form a fourth conductive pattern 815 in the second opening 640.

The fourth insulation pattern 805 and the fourth conductive pattern 815 may form a second through electrode structure 825.

Processes substantially the same as or similar to those illustrated with reference to FIGS. 13 to 15 and FIGS. 1 and 2 may be performed to complete the fabrication of the image sensor.

As illustrated above, the first and second openings 610 and 640 may be formed in the first and second regions I and II of the second substrate 200, the third insulation layer 800 may be formed to fill the first opening 610 and on the sidewall of the second opening 640, the third insulation layer 800 may be etched to form the fourth insulation pattern 805, and the fourth conductive pattern 815 may be formed to fill a remaining portion of the second opening 640.

Thus, the third isolation pattern 802 may be formed on the first isolation pattern 205 in the first region I of the second substrate 200 to form the second isolation structure 905, and the second through electrode structure 825 including the fourth conductive pattern 815 and the fourth insulation pattern 805 may be formed on the second region II of the second substrate 200.

Figure 19A:
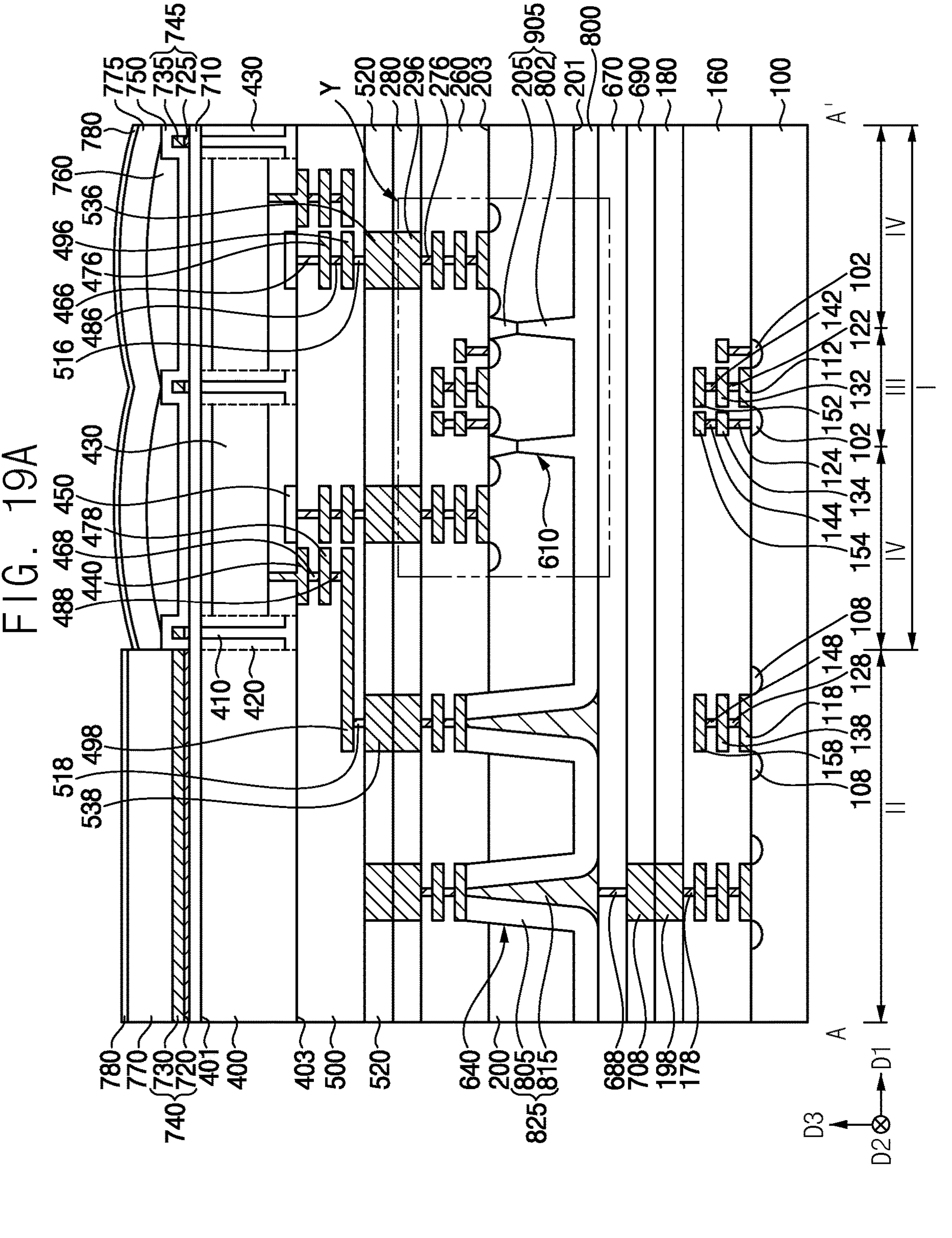
FIGS. 19A and 19B are cross-sectional views illustrating an image sensor in accordance with example embodiments.
Figure 19B:
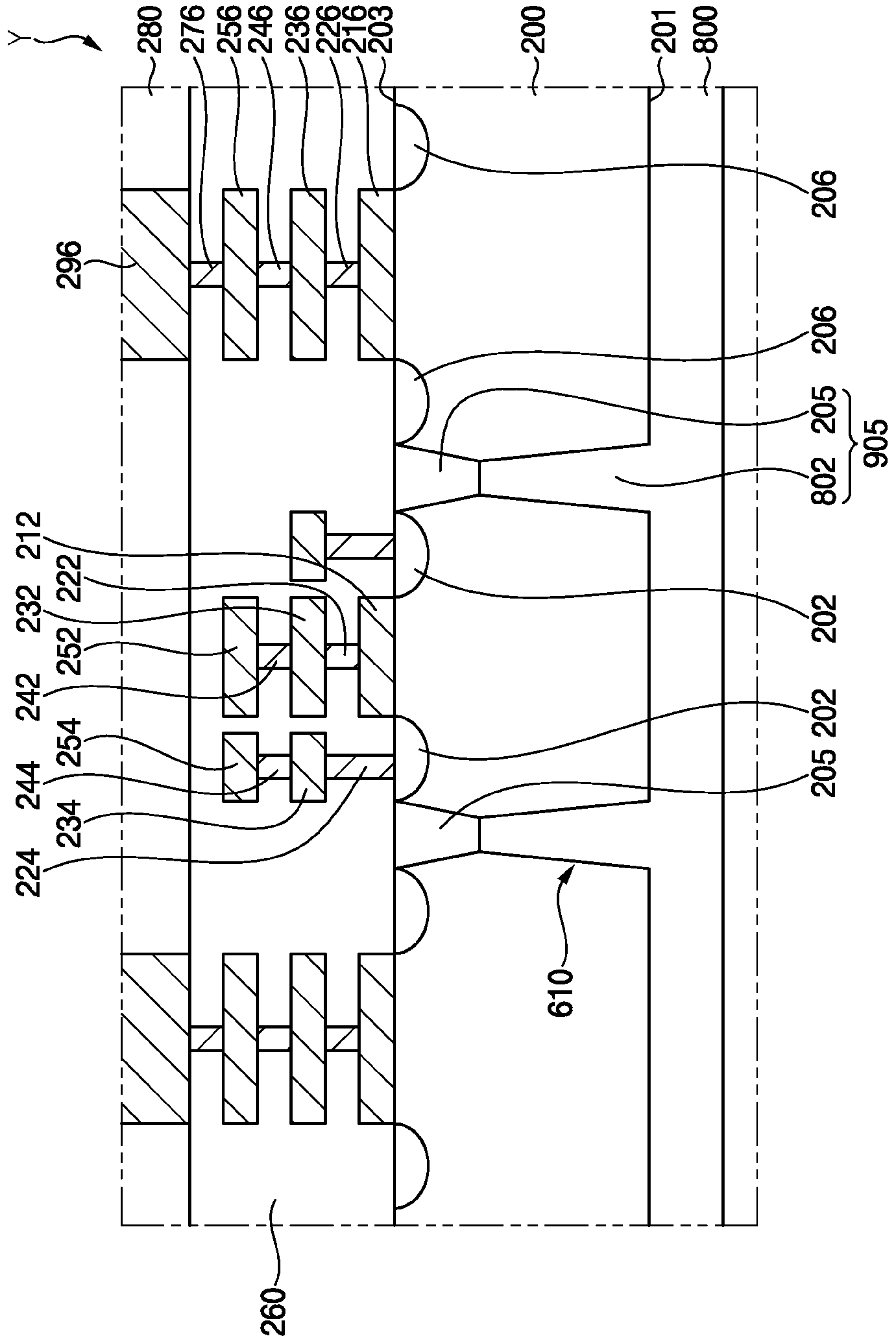

FIGS. 19A and 19B are cross-sectional views illustrating an image sensor in accordance with example embodiments, and FIG. 19B is an enlarged cross-sectional view of region Y of FIG. 19A. This image sensor may be substantially the same as or similar to that of FIGS. 16A and 16B, except for the isolation structure and the through electrode structure and thus repeated explanations are omitted herein.

Referring to FIGS. 19A and 19B, the third insulation layer 800 may remain on the third isolation pattern 802 on the first region I of the second substrate 200, and a lower surface of the fourth conductive pattern 815 included in the second through electrode structure 825 on the second region II of the second substrate 200 may be lower than the first substrate 201 of the second substrate 200.

The above structure may be implemented by forming the third insulation layer 800 through processes illustrated with reference to FIG. 17, forming the fourth conductive layer to fill the second opening 640 without performing the anisotropic etching process on the third insulation layer 800 in the processes illustrated with reference to FIG. 18, and planarizing the fourth conductive layer until the upper surface of the third insulation layer 800 is exposed.

A portion of the third insulation layer 800 in the first opening 610 may be referred to as the third insulation pattern 802 or the third isolation pattern 802, and the first and third isolation patterns 205 and 802 may form the second isolation structure 905.

Additionally, a portion of the third insulation layer 800 filling the second opening 640 and provided on, and in an example embodiment covering, a sidewall of the fourth conductive pattern 815 protruding from the first surface 201 of the second substrate 200 downwardly may be referred to as the fourth insulation pattern 805, and the fourth conductive pattern 815 and the fourth insulation pattern 805 may form the second through electrode structure 825.

Figure 20:
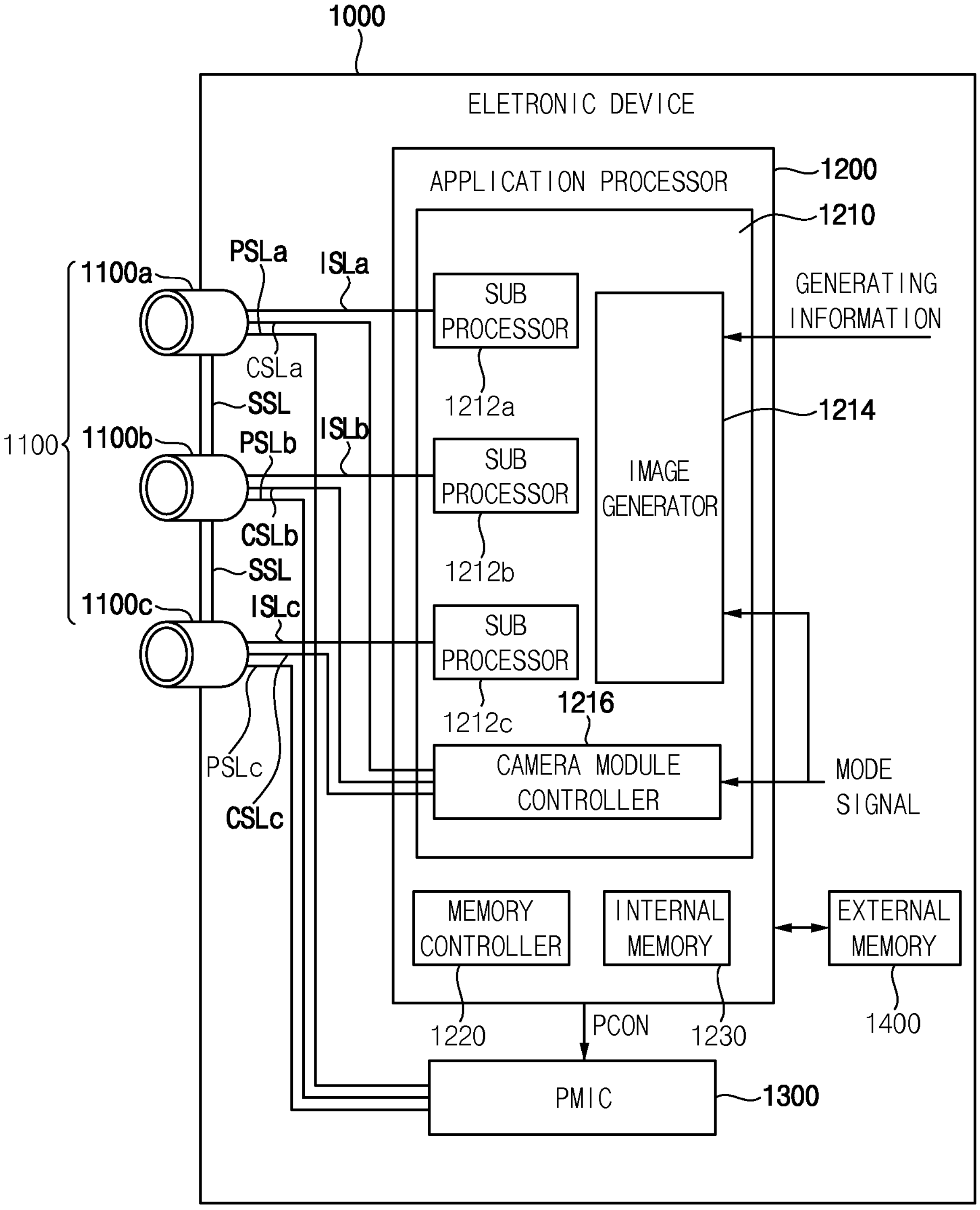
FIG. 20 is a block diagram illustrating an electronic device including an image sensor in accordance with example embodiments.
Figure 21:
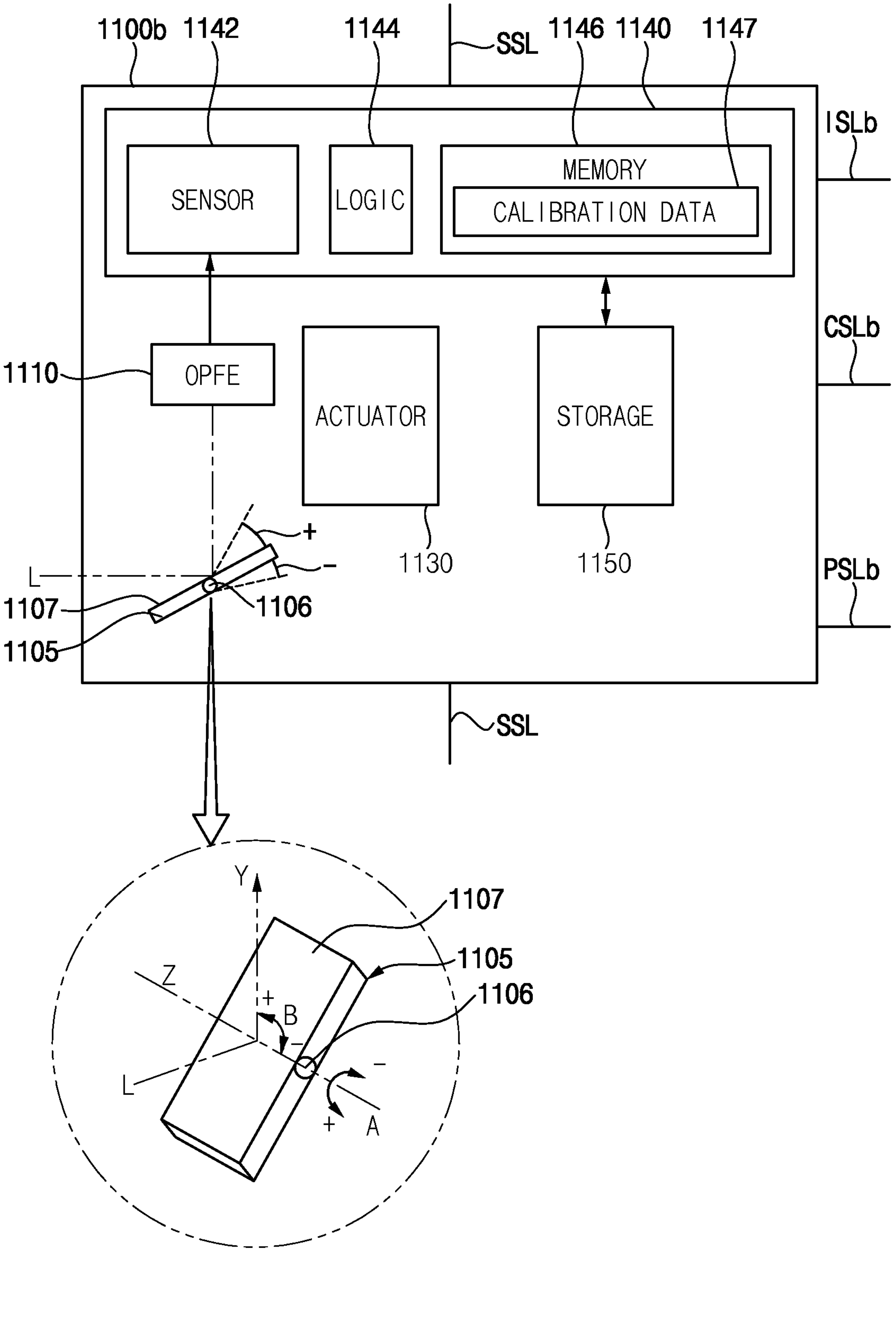
FIG. 21 is a block diagram illustrating a camera module included in the electronic device of FIG. 20.

FIG. 20 is a block diagram illustrating an electronic device including an image sensor in accordance with example embodiments, and FIG. 21 is a block diagram illustrating a camera module included in the electronic device of FIG. 20.

The image sensor may be the image sensors illustrated with reference to FIG. 2 or FIGS. 16 to 19.

Referring to FIG. 20, an electronic device 1000 may include a camera module group 1100, an application processor 1200, a power management integrated circuit (PMIC) 1300 and an external memory 1400.

The camera module group 1100 may include a plurality of camera modules 1100*a*, 1100*b* and 1100*c*. FIG. 20 illustrates the three camera modules 1100*a*, 1100*b* and 1100*c* as an example, however, embodiments are not limited to a particular number of camera modules. According to example embodiments, the camera module group 1100 may include only two camera modules, or more than three camera modules.

Hereinafter, an example configuration of the camera module 1100*b* is described with reference to FIG. 21, however, the same descriptions may be applied to the other camera modules 1100*a* and 1100*c*.

Referring to FIG. 21, the camera module 1100*b* may include a prism 1105, an optical path folding element (OPFE) 1110, an actuator 1130, an image sensing device 1140 and a storage device 1150.

The prism 1105 may include a reflection surface 1107 that may change a path of a light L incident onto the prism 1105.

In example embodiments, the prism 1105 may change the path of the light L incident in a first direction X to a second direction Y perpendicular to the first direction X. In addition, the prism 1105 may rotate the reflection surface 1107 around a center axis 1106 in A direction and/or rotate the center axis 1106 in a B direction to align the path of the reflected light along the second direction Y. The OPFE 1110 may move in a third direction Z perpendicular to the first direction X and the second direction Y.

In example embodiments, a rotation angle of the prism 1105 may be equal to or less than about 15 degrees in the positive (+) A direction and equal to or more than about 15 degrees in the negative (−) A direction, but embodiments are not limited thereto.

In example embodiments, the prism 1105 may rotate within about 20 degrees, between about 10 degrees and about 20 degrees, or between about 15 degrees to about 20 degrees in the positive or negative B direction.

In example embodiments, the prism 1105 may move the reflection surface 1107 in the third direction Z that is in parallel with the center axis 1106.

The OPFE 1110 may include optical lenses that are divided into m groups where m is a positive integer. The m lens group may move in the second direction Y to change an optical zoom ratio of the camera module 1100*b*. For example, the optical zoom ratio may be changed in a range of 3K, 5K, and so on by moving the m lens group, when K is a basic optical zoom ratio of the camera module 1100*b*.

The actuator 1130 may move the OPFE 1110 or the optical lens to a specific position. For example, the actuator 1130 may adjust the position of the optical lens for accurate sensing such that an image sensor 1142 may be located at a position corresponding to a focal length of the optical lens.

The image sensing device 1140 may include the image sensor 1142, a control logic 1144 and a memory 1146. The image sensor 1142 may be substantially the same as or similar to that of FIG. 2 or FIGS. 16 to 19, and may capture or sense an image using the light L provided through the optical lens. The control logic 1144 may control overall operations of the camera module 1100*b*. For example, the control logic 1144 may provide control signals through control signal line CSLb to control the operation of the camera module 1100*b*.

The memory 1146 may store information such as calibration data 1147 for the operation of the camera module 1100*b*. For example, the calibration data 1147 may include information for generation of image data based on the provided light L, such as information on the above-described rotation angle, a focal length, an optical axis, and so on. If the camera module 1100*b* is implemented as a multi-state camera having a variable focal length depending on the position of the optical lens, the calibration data 1147 may include multiple focal length values and auto-focusing values corresponding to the multiple states.

The storage device 1150 may store the image data sensed via the image sensor 1142. The storage device 1150 may be disposed at an outside of the image sensing device 1140, and may be stacked with a sensor chip including the image sensing device 1140. The storage device 1150 may be implemented with an electrically erasable programmable read-only memory (EEPROM), but embodiments are not limited thereto.

Referring to FIGS. 20 and 21, each of the camera modules 1100*a*, 1100*b* and 1100*c* may include the actuator 1130. Thus, the camera modules 1100*a*, 1100*b* and 1100*c* may include the same or different calibration data 1147 depending on the operations of the actuators 1130.

In example embodiments, one camera module 1100*b* may have a folded lens structure including the above-described prism 1105 and the OPFE 1110, and the other camera modules 1100*a* and 1100*b* may have a vertical structure without the prism 1105 and the OPFE 1110, however, embodiments are not limited thereto.

In example embodiments, one camera module 1100*c* may be a depth camera configured to measure distance information of an object using an infrared (IR) light. In this case, the application processor 1200 may merge the distance information provided from the depth camera 1100*c* and image data provided from the other camera modules 1100*a* and 1100*b* to generate a three-dimensional depth image.

In example embodiments, at least two camera modules, for example, the camera modules 1100*a* and 1100*b* among the camera modules 1100*a*, 1100*b* and 1100*c* may have different field of views, for example, through different optical lenses.

In example embodiments, the camera modules 1100*a*, 1100*b* and 1100*c* may be separated physically from each other. In other words, the camera modules 1100*a*, 1100*b* and 1100*c* may each include a dedicated image sensor 1142.

The application processor 1200 may include an image processing device 1210, a memory controller 1220 and an internal memory 1230. The application processor 1200 may be separated from the camera modules 1100*a*, 1100*b* and 1100*c*. For example, the application processor 1200 may be implemented as one chip and the camera modules 1100*a*, 1100*b* and 1100*c* may implemented as another chip or other chips.

The image processing device 1210 may include a plurality of sub image processors 1212*a*, 1212*b* and 1212*c*, an image generator 1214 and a camera module controller 1216.

The image data generated by the camera modules 1100*a*, 1100*b* and 1100*c* may be provided to the sub image processors 1212*a*, 1212*b* and 1212*c* through distinct image signal lines ISLa, ISLb and ISLc, respectively. For example, image data generated from the camera module 1100*a* may be provided to the sub image processor 1212*a* through the image signal line LSLa, image data generated from the camera module 1100*b* may be provided to the sub image processor 1212*b* through the image signal line LSLb, and image data generated from the camera module 1100*c* may be provided to the sub image processor 1212*c* through the image signal line LSLc. The transfer of the image data may be performed using a camera serial interface (CSI) based on the mobile industry processor interface (MIPI), however, embodiments are not limited thereto.

In example embodiments, one sub image processor may be assigned commonly to two or more camera modules. In this case, a multiplexer may be used to transfer the image data selectively from one of the camera modules to the shared sub image processor.

The image data from the sub image processors 1212*a*, 1212*b* and 1212*c* may be provided to the image generator 1214. The image generator 1214 may generate an output image using the image data from the sub image processors 1212*a*, 1212*b* and 1212*c* according to image generating information or a mode signal.

For example, the image generator 1214 may merge at least a portion of the image data from the camera modules 1100*a*, 1100*b* and 1100*c* having the different fields of view to generate the output image according to the image generating information or the mode signal. In addition, the image generator 1214 may select, as the output image, one of the image data from the camera modules 1100*a*, 1100*b* and 1100*c* according to the image generating information or the mode signal.

In example embodiments, the image generating information may include a zoom factor or a zoom signal. In example embodiments, the mode signal may be a signal based on a selection of a user.

If the image generating information is the zoom factor and the camera modules 1100*a*, 1100*b* and 1100*c* have the different field of views, the image generator 1214 may perform different operations depending on the zoom signal. For example, if the zoom signal is a first signal, the image generator 1214 may merge the image data from the different camera modules to generate the output image. If the zoom signal is a second signal different from the first signal, the image generator 1214 may select, as the output image, one of image data from the camera modules 1100*a*, 1100*b* and 1100*c*.

In example embodiments, the image generator 1214 may receive the image data of different exposure times from the camera modules 1100*a*, 1100*b* and 1100*c*. In this case, the image generator 1214 may perform high dynamic range (HDR) processing with respect to the image data from the camera modules 1100*a*, 1100*b* and 1100*c* to generate the output image having the increased dynamic range.

The camera module controller 1216 may provide control signals to the camera modules 1100*a*, 1100*b* and 1100*c*. The control signals generated by the camera module controller 1216 may be provided to the camera modules 1100*a*, 1100*b* and 1100*c* through the distinct control signal lines CSLa, CSLb and CSLc, respectively.

In example embodiments, one of the camera modules 1100*a*, 1100*b* and 1100*c* may be designated as a master camera according to the image generating information of the mode signal, and the other camera modules may be designated as slave cameras. These data may be included in the control signal, and may be provided to corresponding camera modules 1100*a*, 1100*b* and 1100*c* through the distinct control signal lines CSLa, CSLb and CSLc.

The camera module acting as the master camera may be changed according to the zoom factor or an operation mode signal. For example, if the camera module 1100*a* has the wider field of view than the camera module 1100*b* and the zoom factor indicates a lower zoom magnification, the camera module 1100*b* may be designated as the master camera. In contrast, if the zoom factor indicates a higher zoom magnification, the camera module 1100*a* may be designated as the master camera.

In example embodiments, the control signals provided from the camera module controller 1216 may include a synch enable signal. For example, if the camera module 1100*b* is the master camera and the camera modules 1100*a* and 1100*c* are the slave cameras, the camera module controller 1216 may provide the synch enable signal to the camera module 1100*b*. The camera module 1100*b* may generate a synch signal based on the provided synch enable signal and provide the synch signal to the camera modules 1100*a* and 1100*c* through a synch signal line SSL. As such, the camera modules 1100*a*, 1100*b* and 1100*c* may transfer the synchronized image data to the application processor 1200 based on the synch signal.

In example embodiments, the control signals provided from the camera module controller 1216 may include information on the operation mode. The camera modules 1100*a*, 1100*b* and 1100*c* may operate in a first operation mode or a second operation mode based on the information from the camera module controller 1216.

In the first operation mode, the camera modules 1100*a*, 1100*b* and 1100*c* may generate image signals with a first speed (e.g., a first frame rate) and encode the image signals with a second speed higher than the first speed (e.g., a second frame rate higher than the first frame rate) to transfer the encoded image signals to the application processor 1200. The second speed may be lower than thirty times the first speed. The application processor 1200 may store the encoded image signals in the internal memory 1230 or the external memory 1400. The application processor 1200 may read out and decode the encoded image signals to provide display data to a display device. For example, the sub image processors 1212*a*, 1212*b* and 1212*c* may perform the decoding operation and the image generator 1214 may process the decoded image signals.

In the second operation mode, the camera modules 1100*a*, 1100*b* and 1100*c* may generate image signals with a third speed lower than the first speed (e.g., the third frame rate lower than the first frame rate) to transfer the generated image signals to the application processor 1200. In other words, the image signals that are not encoded may be provided to the application processor 1200. The application processor 1200 may process the received image signals or store the receive image signals in the internal memory 1230 or the external memory 1400.

The internal memory 1230 may be controlled by the memory controller 1220.

The PMIC 1300 may provide a power supply voltage to the camera modules 1100*a*, 1100*b* and 1100*c*, respectively. For example, the PMIC 1300 may provide, under control of the application processor 1200, a first power to the camera module 1100*a* through a power line PSLa, a second power to the camera module 1100*b* through a power line PSLb, and a third power to the camera module 1100*c* through a power line PSLc.

The PMIC 1300 may generate the power respectively corresponding to the camera modules 1100*a*, 1100*b* and 1100*c* and control power levels, in response to a power control signal PCON from the application processor 1200. The power control signal PCON may include information on the power depending on the operation modes of the camera modules 1100*a*, 1100*b* and 1100*c*. For example, the operation modes may include a low power mode in which the camera modules 1100*a*, 1100*b* and 1100*c* operate in low powers. The power levels of the camera modules 1100*a*, 1100*b* and 1100*c* may be the same as or different from each other. In addition, the power levels may be changed dynamically or adaptively.

In an image sensor in accordance with one or more example embodiments, the isolation structure may be formed through the substrate including the analog block and the digital block in which the analog circuit pattern and the digital circuit pattern are formed, so that the analog block and the digital block may be electrically insulated from each other. Accordingly, in one or more example embodiments, an electric interference and noise between the analog circuit pattern and the digital circuit pattern may be reduced.

While aspects of example embodiments have been particularly shown and described, it will be understood that various changes in form and details may be made therein without departing from the spirit and scope of the following claims.

What is claimed is:

1. An image sensor comprising:

a first substrate comprising an analog block and a digital block;

an isolation structure extending through the first substrate and dividing the analog block from the digital block;

a first transistor on the digital block;

a second transistor on the analog block;

a wiring on the second transistor, the wiring being electrically connected to the second transistor;

a second substrate on the wiring;

a color filter array layer on the second substrate, the color filter array layer comprising color filters;

a microlens on the color filter array layer;

a light sensing element in the second substrate;

a transfer gate extending through a lower portion of the second substrate, the transfer gate being adjacent to the light sensing element; and a floating diffusion region at the lower portion of the second substrate adjacent to the transfer gate, the floating diffusion region being electrically connected to the wiring, wherein the isolation structure comprises:

a first isolation pattern extending through an upper portion of the first substrate; and a second isolation pattern structure extending through a lower portion of the first substrate and contacting the first isolation pattern, the second isolation pattern structure comprising:

a conductive pattern comprising a metal; and an insulation pattern provided on a sidewall and an upper surface of the conductive pattern, the insulation pattern directly contacting a lowermost surface of the first isolation pattern.

2. The image sensor of claim 1, wherein a width of the first isolation pattern gradually decreases from an upper portion of the first isolation pattern toward a lower portion of the first isolation pattern, and a width of the second isolation pattern structure gradually increases from an upper portion of the second isolation pattern structure toward a lower portion of the second isolation pattern structure.

3. The image sensor of claim 1, wherein the insulation pattern comprises a metal oxide.

4. The image sensor of claim 1, wherein the first isolation pattern comprises silicon oxide, and the second isolation pattern structure comprises a metal oxide.

5. The image sensor of claim 1, further comprising a plurality of isolation structures including the isolation structure, the plurality of isolation structures being spaced apart from each other in a first direction substantially parallel to an upper surface of the second substrate, and each of the plurality of isolation structures extending in a second direction substantially parallel to the upper surface of the second substrate and crossing the first direction.

6. The image sensor of claim 1, wherein the isolation structure has a lattice shape.

7. The image sensor of claim 1, wherein the first substrate comprises a first region and a second region around the first region, wherein the isolation structure is provided in the first region of the first substrate, wherein the image sensor further comprises a through electrode structure extending through the second region of the first substrate, and wherein a width of the through electrode structure gradually increases from an upper portion of the through electrode structure toward a lower portion of the through electrode structure.

8. The image sensor of claim 1, further comprising:

a first insulating interlayer on the first substrate, the first insulating interlayer provided on the first transistor, the second transistor and the wiring;

a first adhesion layer on the first insulating interlayer, the first adhesion layer comprising a first adhesion pad;

a second adhesion layer on the first adhesion layer, the second adhesion layer comprising a second adhesion pad contacting the first adhesion pad; and a second insulating interlayer between the second adhesion layer and the second substrate, the second insulating interlayer provided on the transfer gate and the floating diffusion region.

9. The image sensor of claim 1, further comprising:

a third substrate under the second substrate;

a third transistor on the third substrate; and an insulating interlayer between the third substrate and the second substrate, the insulating interlayer provided on the third transistor.

10. The image sensor of claim 9, further comprising a conductive layer on a lower surface of the first substrate, the conductive layer being connected to the isolation structure and comprising a metal.

11. The image sensor of claim 9, wherein the first transistor is included in a circuit of a memory device, the second transistor is a source follower (SF) transistor, and the third transistor is included in a logic circuit.

12. An image sensor comprising:

a first substrate;

an isolation structure comprising:

a first isolation pattern extending through an upper portion of the first substrate; and a second isolation pattern structure extending through a lower portion of the first substrate and contacting the first isolation pattern, the second isolation pattern structure comprising a material that is different from a material of the first isolation pattern;

a first transistor on the first substrate;

a wiring on the first transistor, the wiring being electrically connected to the first transistor;

a second substrate on the wiring;

a color filter array layer on the second substrate, the color filter array layer comprising color filters;

a microlens on the color filter array layer;

a light sensing element in the second substrate;

a transfer gate extending through a lower portion of the second substrate, the transfer gate being adjacent to the light sensing element; and a floating diffusion region at the lower portion of the second substrate adjacent to the transfer gate, the floating diffusion region being electrically connected to the wiring, wherein the second isolation pattern structure comprises:

a conductive pattern comprising a metal; and an insulation pattern provided on a sidewall and an upper surface of the conductive pattern, the insulation pattern directly contacting a lowermost surface of the first isolation pattern.

13. The image sensor of claim 12, wherein a width of the first isolation pattern gradually decreases from an upper portion of the first isolation pattern toward a lower portion of the first isolation pattern, and a width of the second isolation pattern structure gradually increases from an upper portion of the second isolation pattern structure toward a lower portion of the second isolation pattern structure.

14. The image sensor of claim 12, further comprising:

a third substrate under the second substrate;

a second transistor on the third substrate; and an insulating interlayer between the third substrate and the second substrate, the insulating interlayer being provided on the second transistor.

15. The image sensor of claim 14, further comprising a conductive layer on a lower surface of the first substrate, the conductive layer being connected to the isolation structure and comprising a metal.

16. The image sensor of claim 15, the second transistor is included in a logic circuit.

17. An image sensor comprising:

a first substrate having a logic circuit thereon;

a second substrate over the first substrate, the second substrate comprising an analog block and a digital block, wherein an analog circuit is provided in the analog block and a digital circuit is provided in the digital block;

an isolation structure extending through the second substrate and dividing the analog block from the digital block, the isolation structure comprising:

a first isolation pattern extending through an upper portion of the second substrate; and a second isolation pattern structure extending through a lower portion of the second substrate and contacting the first isolation pattern;

a third substrate on the second substrate;

a color filter array layer on the third substrate, the color filter array layer comprising color filters;

a microlens on the color filter array layer;

a light sensing element in the third substrate;

a transfer gate extending through a lower portion of the third substrate, the transfer gate being adjacent to the light sensing element; and a floating diffusion region at the lower portion of the third substrate adjacent to the transfer gate, the floating diffusion region being electrically connected to a wiring, wherein the second isolation pattern structure comprises:

a conductive pattern comprising a metal; and an insulation pattern provided on a sidewall and an upper surface of the conductive pattern, the insulation pattern directly contacting a lowermost surface of the first isolation pattern.

18. The image sensor of claim 17, further comprising a conductive layer on a lower surface of the second substrate, the conductive layer being connected to the isolation structure.

* * * * *